(12) United States Patent
Zhang et al.

(10) Patent No.: US 10,756,304 B2
(45) Date of Patent: Aug. 25, 2020

(54) ORGANIC LIGHT-EMITTING DISPLAY PANEL AND DISPLAY DEVICE THEREOF

(71) Applicant: Wuhan Tianma Micro-Electronics Co., Ltd., Wuhan (CN)

(72) Inventors: Guofeng Zhang, Wuhan (CN); Yingteng Zhai, Shanghai (CN); Haijing Chen, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/944,600

(22) Filed: Apr. 3, 2018

(65) Prior Publication Data

US 2018/0226616 A1 Aug. 9, 2018

(30) Foreign Application Priority Data

Nov. 30, 2017 (CN) .......................... 2017 1 1240791

(51) Int. Cl.
*H01L 51/52* (2006.01)
*H01L 51/50* (2006.01)
*H01L 27/32* (2006.01)

(52) U.S. Cl.
CPC ...... *H01L 51/5275* (2013.01); *H01L 51/5056* (2013.01); *H01L 51/5206* (2013.01);
(Continued)

(58) Field of Classification Search
CPC ............. H01L 51/5275; H01L 51/5056; H01L 51/5206; H01L 51/5221; H01L 51/5253; H01L 51/5265
See application file for complete search history.

(56) References Cited

U.S. PATENT DOCUMENTS 7,843,123 B2 * 11/2010 Mizuno ................. C09K 11/06
313/501
10,270,045 B2 * 4/2019 Fujiwara ................. H01L 33/24
(Continued)

FOREIGN PATENT DOCUMENTS

CN 103000824 A 3/2013
CN 105027671 A 11/2015
(Continued)

*Primary Examiner* — Dale E Page
*Assistant Examiner* — Quovaunda Jefferson
(74) *Attorney, Agent, or Firm* — Anova Law Group PLLC

(57) ABSTRACT

An organic light-emitting display panel and a display device are provided. The light-emitting display panel includes a first electrode layer including a reflective electrode, and a second electrode layer arranged opposite to the first electrode layer and including a semi-reflective electrode. The light-emitting display panel also includes a light-emitting material layer between the two electrode layers. The second electrode layer has a first side facing the light-emitting material layer and an opposing second side. Further, the light-emitting display panel includes a light-coupling layer group disposed on the opposing second side of the second electrode layer. The light-coupling layer group includes at least one light-coupling stacked layer including a first light-coupling layer arranged close to the second electrode layer and a second light-coupling layer arranged far away from the second electrode layer. A refractive index of the first light-coupling layer is larger than a refractive index of the second light-coupling layer.

17 Claims, 13 Drawing Sheets

(52) U.S. Cl.
CPC ...... *H01L 51/5221* (2013.01); *H01L 51/5253* (2013.01); *H01L 51/5265* (2013.01); *H01L 27/3211* (2013.01)

(56) References Cited

U.S. PATENT DOCUMENTS

| | | | | |
|---|---|---|---|---|
| 2005/0008768 | A1* | 1/2005 | Onishi | G02B 5/1847 427/66 |
| 2012/0019915 | A1* | 1/2012 | Yan | B32B 33/00 359/586 |
| 2015/0188086 | A1* | 7/2015 | Hou | H01L 51/5271 257/40 |
| 2016/0049562 | A1* | 2/2016 | Inada | H01L 51/5275 257/98 |
| 2019/0043931 | A1* | 2/2019 | Yim | H01L 27/3211 |

FOREIGN PATENT DOCUMENTS

| | | |
|---|---|---|
| CN | 105280838 A | 1/2016 |
| CN | 106129266 A | 11/2016 |
| CN | 106684256 A | 5/2017 |
| WO | 2016002310 A1 | 1/2016 |

\* cited by examiner

ORGANIC LIGHT-EMITTING DISPLAY PANEL AND DISPLAY DEVICE THEREOF

CROSS-REFERENCES TO RELATED APPLICATIONS

This application claims the priority of Chinese patent application No. 201711240791.5, filed on Nov. 30, 2017, the entirety of which is incorporated herein by reference.

FIELD OF THE DISCLOSURE

The present disclosure generally relates to the field of display technology and, more particularly, relates to an organic light-emitting display panel and a display device thereof.

BACKGROUND

When an electric current is passed through a light-emitting diode using an organic light-emitting diode (OLED) as a semiconductor material, holes generated from an anode and electrons generated from the cathode recombine in a light-emitting layer with the release of photons. By adjusting the energy released by electron-hole pair recombination in the OLED device, photons with different energies corresponding to different colors of light may be emitted. An organic light-emitting display panel using an OLED device as a display material has many advantages, such as self-luminous, wide viewing angle and high contrast, etc., and has been widely used in smart products, such as a mobile phone, a digital video camera, and a laptop computer, etc. Because of its light weight, thin thickness, and flexibilities, the organic light-emitting display panel becomes a research focus.

The organic light-emitting device often has a sandwich structure with electrodes on both sides and an organic functional layer sandwiched there between. Light is emitted from a transparent or a translucent electrode. Indium tin oxide (ITO) is often used as an anode for the OLED device due to its high light transmittance in the visible range, desired conductivity and holes injection capability. For the material of the organic functional layer, film is generally formed by vacuum deposition and spin-coating processes. A cathode of the OLED device is often formed by deposition or sputtering using materials with low work function, such as aluminum, zinc, lead or calcium, etc.

FIG. 1 illustrates a schematic diagram of a basic structure of an existing OLED device. Referring to FIG. 1, the OLED device includes an anode 011', a hole transport layer 012', a light-emitting layer 013', an electron transport layer 014' and a cathode 015' from bottom to top. Based on the above structure of the OLED device 01', due to the introduction of the hole transport layer 012', the electron transport layer 014' and other various organic functional layers, the thickness of the OLED device 01' is equal to the value of the light wavelength. Meanwhile, a semi-reflective electrode (i.e., one of the anode 011' and the cathode 015') can be regarded as a semi-reflective film, and the reflective electrode (i.e. the other of the cathode 015' and the anode 011') can be regarded as a full-reflective film. Therefore, the OLED device 01' with such structure has a micro-cavity effect to some extent. Due to the high quality factor of the micro-cavity structure, a high-intensity and long-life light field may be formed inside the micro-cavity.

Due to the angle-dependent characteristics of the micro-cavity structure of the OLED, the brightness and the light-emitting color of the organic light-emitting display panel fabricated using the above OLED device vary with the viewing angle. To solve such technical issue, a film layer with high refractive index and low absorption rate as a light-coupling layer is deposited outside of a light-emitting side electrode (the semi-reflective electrode) of the organic light-emitting display panel, thereby improving the light transmittance of the organic light emitting display panel and the light-emission efficiency of the device without affecting the electrical performance of the device.

However, the improvement of the light-emission efficiency by using one light-coupling layer is rather limited. Therefore, how to provide an organic light-emitting display panel and a display device capable of further improving the light-emission efficiency is an urgent issue to be solved. The disclosed organic light-emitting display panel and device are directed to solve one or more problems set forth above and other problems.

BRIEF SUMMARY OF THE DISCLOSURE

One aspect of the present disclosure includes a light-emitting display panel. The light-emitting display panel includes a first electrode layer including a reflective electrode, and a second electrode layer arranged opposite to the first electrode layer and including a semi-reflective electrode. The light-emitting display panel also includes a light-emitting material layer disposed between the first electrode layer and the second electrode layer. The second electrode layer has a first side facing the light-emitting material layer and an opposing second side far away from the light-emitting material layer. Further, the light-emitting display panel includes a light-coupling layer group disposed on the opposing second side of the second electrode layer. The light-coupling layer group includes at least one light-coupling stacked layer, the at least one light-coupling stacked layer includes a first light-coupling layer arranged close to the second electrode layer and a second light-coupling layer arranged far away from the second electrode layer. A refractive index of the first light-coupling layer is larger than a refractive index of the second light-coupling layer in the at least one light-coupling stacked layer.

Another aspect of the present disclosure includes a display device. The display device includes an organic light-emitting display panel. The light-emitting display panel includes a first electrode layer including a reflective electrode, and a second electrode layer arranged opposite to the first electrode layer and including a semi-reflective electrode. The light-emitting display panel also includes a light-emitting material layer disposed between the first electrode layer and the second electrode layer. The second electrode layer has a first side facing the light-emitting material layer and an opposing second side far away from the light-emitting material layer. Further, the light-emitting display panel includes a light-coupling layer group disposed on the opposing second side of the second electrode layer. The light-coupling layer group includes at least one light-coupling stacked layer, the at least one light-coupling stacked layer includes a first light-coupling layer arranged close to the second electrode layer and a second light-coupling layer arranged far away from the second electrode layer. A refractive index of the first light-coupling layer is larger than a refractive index of the second light-coupling layer in the at least one light-coupling stacked layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

To further improve the light-emission efficiency of the organic light-emitting display panel, in existing technologies, a light-coupling layer with high refractive index is provided on the light-emitting side of the organic light-emitting display panel.

Figure 1:
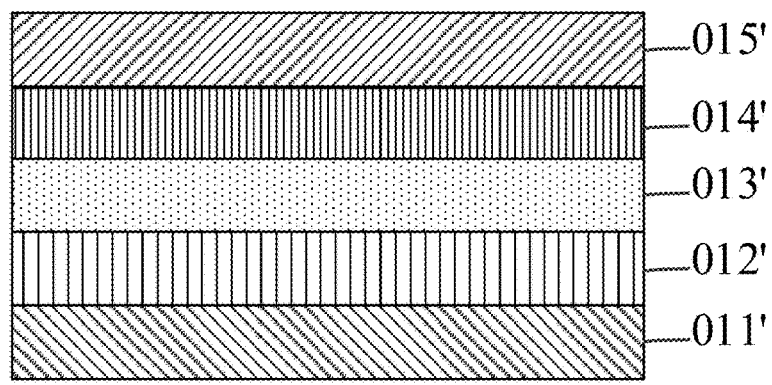
FIG. 1 illustrates a schematic diagram of a basic structure of an existing OLED device.
Figure 2:
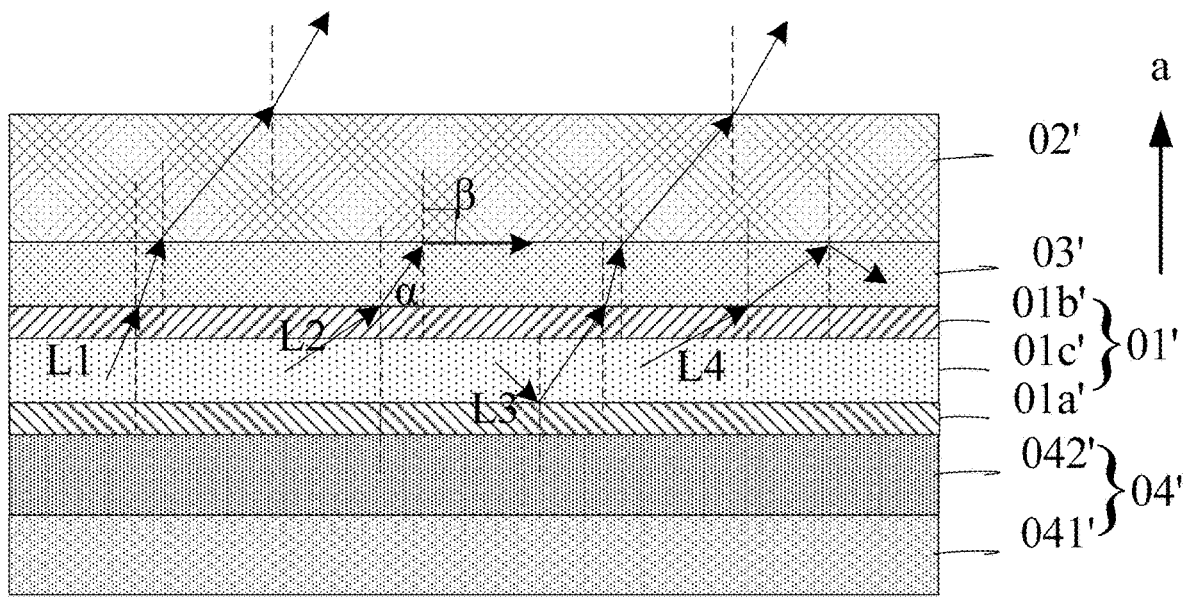
FIG. 2 illustrates a schematic cross-sectional view of an existing organic light-emitting display panel.
Figure 3:
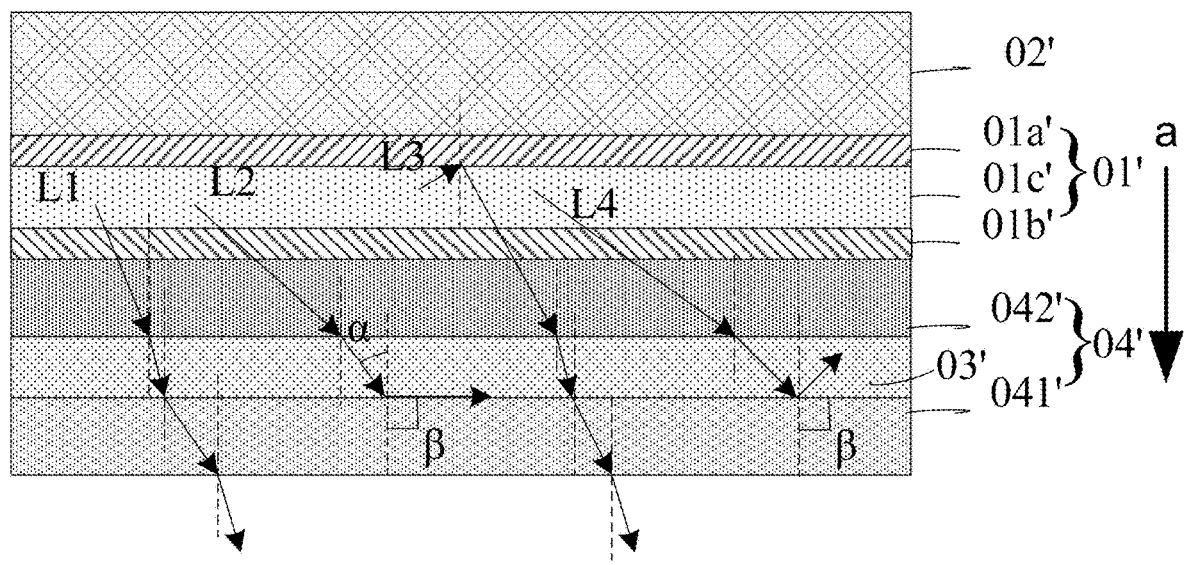
FIG. 3 illustrates a schematic cross-sectional of another existing organic light-emitting display panel.

FIG. 2 illustrates a schematic cross-sectional view of an existing organic light-emitting display panel, and FIG. 3 illustrates a schematic cross-sectional of another existing organic light-emitting display panel. Referring to FIG. 2 and FIG. 3, the organic light-emitting display panel includes an OLED device 01', an encapsulation layer 02', an array substrate 04', and a light-coupling layer 03' on the light-emitting/light-outgoing side. The OLED device 01' includes a reflective electrode 01a', a semi-reflective electrode 01b', and a light-emitting material 01c' disposed between the reflective electrode 01a' and the semi-reflective electrode 01b'.

FIG. 2 illustrates a top-emission type organic light-emitting display panel. Light is emitted from the encapsulation layer 02'. The light-coupling layer 03' is disposed between the OLED device 01' and the encapsulation layer 02'. The light generated by the OLED device 01' successively passes through the light-coupling layer 03' and the encapsulation layer 02'. For an example, for a rigid organic light-emitting display panel, the encapsulation layer 02' is encapsulated using a glass cover plate. The glass cover plate often has a refractive index of about 1.5 and a thickness of several hundred micrometers. For another example, for a flexible organic light-emitting display panel, the encapsulation layer 02' is a thin-film encapsulation layer. The thin-film encapsulation layer often has a refractive index of about 1.5 and a thickness of ten to several tens of micrometers.

FIG. 3 illustrates a bottom-emission type organic light-emitting display panel. Light is emitted from the array substrate 04'. The array substrate 04' includes a base substrate 041' and a thin-film-transistor layer group 042'. The light-coupling layer 03' is disposed between the OLED device 01' and the base substrate 041'. The light generated by the OLED device 01' successively passes through the light-coupling layer 03' and the base substrate 041'. For an example, for a rigid organic light-emitting display panel, the base substrate 041' is implemented using a glass substrate. The glass substrate often has a refractive index of about 1.5 and a thickness of several hundred micrometers. For another example, for a flexible organic light-emitting display panel, the base substrate is made of a flexible substrate material. The flexible substrate often has a refractive index of between 1.3 and 1.7, and a thickness of several tens of micrometers.

For both the top-emission type and the bottom-emission type organic light-emitting display panels, and for both the flexible and the rigid organic light-emitting display panels, the light passes through the light-coupling layer 03' having a high refractive index and a film layer having a refractive index lower than that of the light-coupling layer 03' (e.g., the encapsulation layer 02', or the base substrate 041'), and then enters the eyes of the viewer.

In optical theory, light travels at different speeds in two different mediums having different refractive indices. When light is obliquely incident on a less dense medium from a more dense medium, refraction and reflection occur at the interface between the two mediums, and a portion of light is also absorbed by the medium during the light propagation. Only light that is refracted and transmitted passes through the less dense medium and is emitted. In other words, when light is incident on the less dense medium from the more dense medium, emitted light includes refracted and transmitted light, while the reflected light re-enters the more dense medium.

Figure 4:
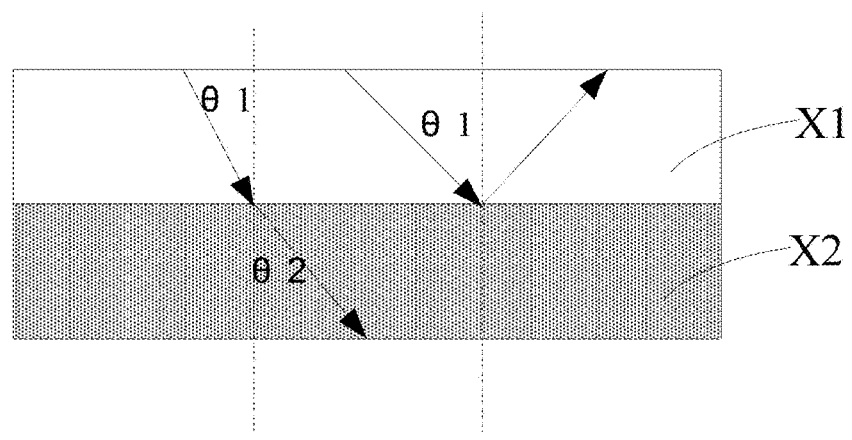
FIG. 4 illustrates a schematic diagram of light refraction in an existing organic light-emitting display panel.

FIG. 4 illustrates a schematic diagram of light refraction in an existing organic light-emitting display panel. Referring to FIG. 4, according to Snell's law, when light travels from a more dense medium X1 having a refractive index of n1' to a less dense medium X2 having a refractive index of n2' and n1'>n2', an incidence angle θ1 and a refraction angle θ2 satisfy n1'/n2'=sin θ2/sin θ1. The critical condition that light can be refracted is θ2 equals 90 degrees. In other words, the critical angle at which light can be refracted is θ1=arcsin (n2'/n1'). Light will be totally internally reflected when the incidence angle θ1 is greater than arcsin (n2'/n1').

Based on the above theory, for the organic light-emitting display panel, light will be totally internally reflected and refracted at the interface between the light-coupling layer 03' and the film layer having a refractive index lower than that of the light-coupling layer 03' (e.g., the encapsulation layer 02' or the base substrate 041').

Referring to FIG. 2 (or FIG. 3), for the organic light-emitting display panel, from the light incident on the encapsulation layer 02' (or the base substrate 041') having a refractive index of n2' from the light-coupling layer 03' having a refractive index of n1', light with an incidence angle θ1 less than arcsin (n2'/n1') is refracted, while light with an incidence angle θ1 greater than arcsin (n2'/n1') is totally internally reflected.

For example, light L2 generated by the light-emitting material 01c' is incident on the light-coupling layer 03' through the semi-reflective electrode 01b', and refracted once at the interface between the semi-reflective electrode 01b' and the light-coupling layer 03'. The incidence angle θ1 incident on the encapsulation layer 02' (or the base substrate 041') from the coupling layer 03' is 'α', which is equal to arcsin (n2/n1), and the emission angle θ2 is 'β', which is equal to 90 degrees. Light L1 generated by the light-emitting material 01c' is incident on the light-coupling layer 03' through the semi-reflective electrode 01b', and refracted once at the interface between the semi-reflective electrode 01b' the light-coupling layer 03'.

Because the incidence angle θ1 incident on the encapsulation layer 02' (or the base substrate 041') from the coupling layer 03' is smaller than 'α', light L1 is refracted at the encapsulation layer 02' and emitted, thereby entering the eyes of the viewer. Light L3 generated by the light-emitting material 01c' is reflected by the reflective electrode 01a', and re-enters the light-emitting material 01c'. Light L3 is incident on the light-coupling layer 03' through the semi-reflective electrode 01b', and refracted once at the interface between the semi-reflective electrode 01b' and the light-coupling layer 03'.

Because the incidence angle θ1 incident on the encapsulation layer 02' (or the base substrate 041') from the coupling layer 03' is smaller than 'α', light L3 is refracted in the encapsulation layer 02' and emitted, thereby entering the eyes of the viewer. Light L4 generated by the light-emitting material 01c' is incident on the light-coupling layer 03' through the semi-reflective electrode 01b', and refracted once at the interface between the semi-reflective electrode 01b' and the light-coupling layer 03'. Because the incidence angle θ1 incident on the encapsulation layer 02' (or the base substrate 041') from the coupling layer 03' is larger than 'α', light L4 is totally internally reflected at the interface between the light-coupling layer 03' and the encapsulation layer 02' (or the base substrate 041'), and then re-enters the light-coupling layer 03'.

Light re-entering the light-coupling layer 03' prorogates back to the OLED device 01', during which the light absorption of each film layer increases. Therefore, when more light is totally internally reflected, more amount of light will be absorbed by the mediums, such that the light-emission efficiency of the organic light-emitting display panel becomes substantially lower.

The light-emission efficiency of the organic light-emitting display panel may be further improved by changing the refractive indices of the light-coupling layer 03' and the encapsulation layer 02' (or the base substrate 041'). In other words, the size of arcsin (n2'/n1') can be changed. Through decreasing the value of arcsin (n2'/n1'), the refracted light is increased and, accordingly, the light-emission efficiency is improved. However, for example, the packaging performance desired by the encapsulation layer 02', and the performance desired by the base substrate 041' for laying the thin-film-transistor layer group 042', etc., may limit the changes on the refractive indices of the light-coupling layer 03' and the encapsulation layer 02' (or the base substrate

041'). Therefore, due to the structure limitation of the organic light-emitting display panel, a bottleneck has been encountered in improving the light-emission efficiency of the organic light-emitting display panel.

Further, not all the light having an incidence angle $\theta1$ larger than $\arcsin(n2'/n1')$ will be totally internally reflected. When the light is incident on the surface of the less dense medium through the more dense medium, the electrons in the less dense medium are excited and transit to the high energy level, and then transit back to low energy level accompanying with the release of photons, causing the total internal reflection of light. The above process is equivalent to reflecting the incident light back to the more dense medium. However, when the number of electrons that can be excited in the less dense medium is insufficient, the incident light may not be entirely absorbed even entire the electrons are excited. In this case, a portion of light will pass through the less dense medium and is transmitted. In view of this, when the transmission probability of the light having the incidence angle $\theta1$ larger than $\arcsin(n2'/n1')$ increases, the light-emission efficiency of the organic light-emitting display panel may be improved from another aspect.

However, the number of electrons capable of being excited in a less dense medium is related to a thickness of the less dense medium. In the existing organic light-emitting display panel shown in FIGS. 2-3, the thickness of the glass substrate and the glass cover plate is often several hundred micrometers, the thickness of the thin film encapsulation layer is often about ten to several tens of micrometers, and the thickness of the flexible substrate is often several tens of micrometers. The base substrate and the encapsulation layer has a thick thickness and has sufficient number of electrons capable of being excited. Therefore, light incident on the encapsulation layer 02'(or the base substrate 041') from the light-coupling layer 03' and having an incidence angle $\theta1$ larger than $\arcsin(n2'/n1')$ is almost totally internally reflected. Reducing the thickness of the above film layers may significantly increase the process cost and degrade the reliability of the organic light-emitting display panel, thereby raising new risks.

The present disclosure provides an improved organic light-emitting display panel and a display device capable of improving the light-emitting efficiency.

The disclosed organic light-emitting display panel may include a reflective electrode, a semi-reflective electrode, and an organic light-emitting material layer between the two electrodes. The semi-reflective electrode may have a first side facing the organic light-emitting material layer, and an opposing second side far away from the organic light-emitting material layer. At least one light-coupling layer group may be disposed on the opposing second side of the semi-reflective electrode, i.e., on the light-emission side of the organic light-emitting display panel.

The light-coupling layer group may include at least one light-coupling stacked layer. The light-coupling stacked layer may include two light-coupling layers having different refractive indices. The refractive index of the light-coupling layer arranged close to the organic light-emitting material layer may be larger than the refractive index of the light-coupling layer arranged far away from the organic light-emitting material layer. The light generated by the organic light-emitting material layer may be emitted through the light-coupling layer having a high refractive index, and the light-emission efficiency of the OLED micro-cavity structure may be improved. The light-coupling layer having a low refractive index may further adjust the light emission of the light-coupling layer having a high refractive index to synergistically enhance the light-emission efficiency. The light-coupling layer having a low refractive index may be arranged above the light-coupling layer having a high refractive index when the light-emitting direction is upward, further facilitating improving the light-emission efficiency of the OLED micro-cavity structure.

Figure 5:
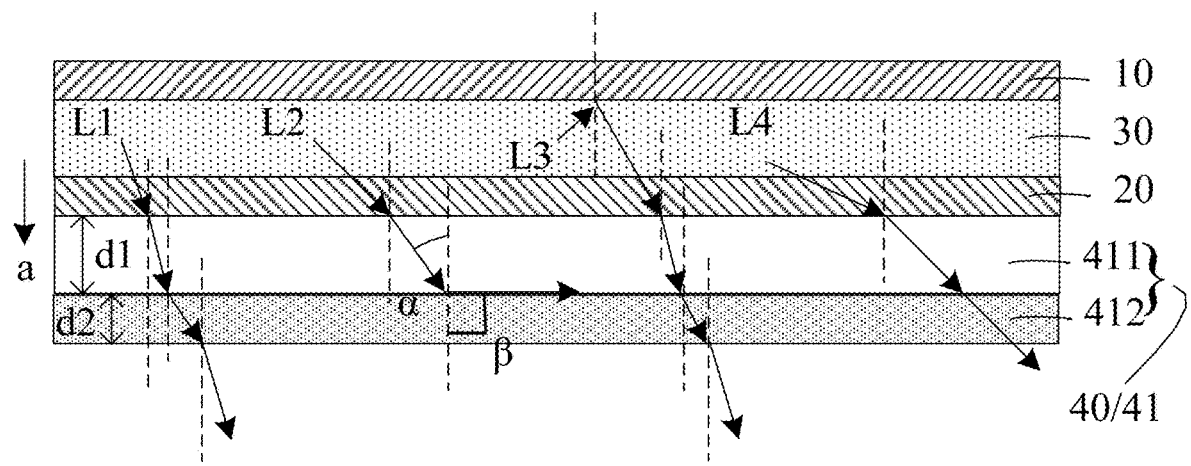
FIG. 5 illustrates a schematic diagram of film layers of an exemplary organic light-emitting display panel consistent with disclosed embodiments of the present disclosure.
Figure 6:
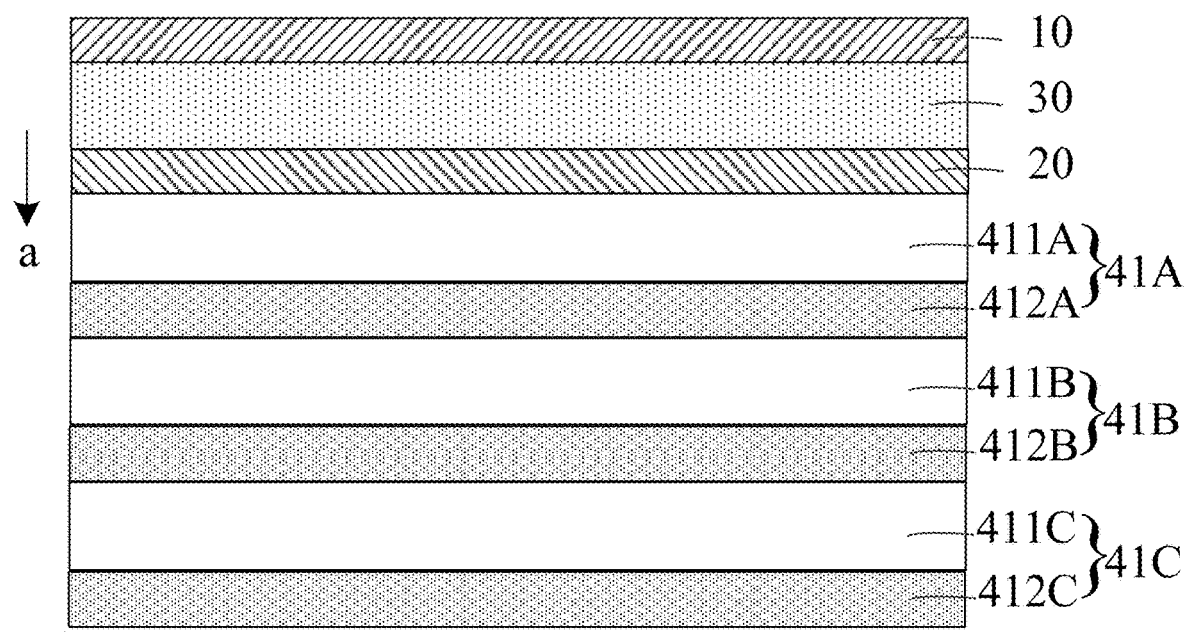
FIG. 6 illustrates a schematic diagram of film layers of another exemplary organic light-emitting display panel consistent with disclosed embodiments of the present disclosure.

FIG. 5 illustrates a schematic diagram of film layers of an exemplary organic light-emitting display panel consistent with disclosed embodiments of the present disclosure; and FIG. 6 illustrates a schematic diagram of film layers of another exemplary organic light-emitting display panel consistent with disclosed embodiments of the present disclosure. Referring to FIG. 5 and FIG. 6, in one embodiment, the organic light-emitting display panel may include a first electrode layer 10, a second electrode layer 20, an organic light-emitting material layer 30, and a light-coupling layer group 40.

The first electrode layer 10 may include a reflective electrode. In one embodiment, the first electrode layer 10 may be made of one or more of Ag, Mg, Al, Pt, Pd, Au, Ni, Nd, Ir, and Cr. The second electrode layer 20 may include a semi-reflective electrode (i.e., approximately 50% transmitted and 50% reflected). In one embodiment, the second electrode layer 20 may be made of indium tin oxide (ITO), indium zinc oxide (IZO), zinc oxide (ZnO), zinc aluminum oxide (ZAO), or indium oxide ($In_2O_3$), etc.

Figure 26:
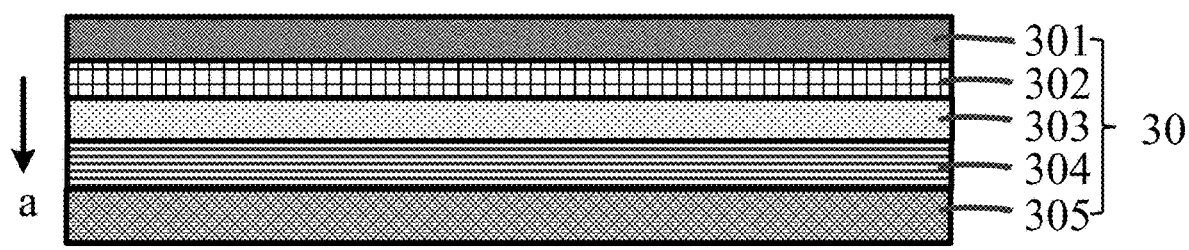
FIG. 26 illustrates a schematic diagram of film layers of an exemplary organic light-emitting material layer in an exemplary organic light-emitting display panel consistent with disclosed embodiments of the present disclosure.

The organic light-emitting material layer 30 may be made of a low-molecular-weight organic material or a high-molecular-weight organic material. Referring to FIG. 26, the organic light-emitting material layer 30 may include a hole injection layer 301, a hole transport layer 302, a light-emitting layer 303, an electron transport layer 304, and an electron injection layer 305. When an electric current is passed through the organic light-emitting material layer 30, holes may reach the light-emitting layer 303 through the hole injection layer 301 and the hole transport layer 302, and electrons may reach the light-emitting layer 303 through the electron injection layer 305 and the electron transport layer 304. The electrons and holes may recombine in the light-emitting layer 303 with the release of photons, such that light may be generated.

The first electrode layer 10 and the second electrode layer 20 may be disposed facing toward each other along a first direction 'a'. The organic light-emitting material layer 30 may be disposed between the first electrode layer 10 and the second electrode layer 20. Because the second electrode layer 20 is a semi-reflective electrode, the light generated by the organic light-emitting material layer 30 may be emitted through the semi-reflective electrode. In other words, the first direction 'a' from the first electrode layer 10 (reflective electrode) to the second electrode layer 20 (semi-reflective electrode) may be the light-emitting direction of the organic light-emitting display panel.

The second electrode layer 20 may have a first face facing the organic light-emitting material layer 30 and an opposing second side far away from the organic light-emitting material layer 30, and the light-coupling layer group 40 may be disposed on the second side of the second electrode layer 20. In other words, along the light-emitting direction of the organic light-emitting display panel, light emitted through the semi-reflective electrode may be incident on the light-coupling layer group 40, and then may be transmitted through the light-coupling layer group 40.

The light-coupling layer group 40 may include at least one light-coupling stacked layer 41. In one embodiment, as shown in FIG. 5, the light-coupling layer group 40 may include one light-coupling stacked layer 41. In another embodiment, as shown in FIG. 6, the light-coupling layer group 40 may include three light-coupling stacked layers 41, i.e., a light-coupling stacked layer 41A, a light-coupling stacked layer 41B, and a light-coupling stacked layer 41C.

The light-coupling stacked layer 41 may include a first light-coupling layer 411 arranged close to the second electrode layer 20, and a second light-coupling layer 412 arranged far away from the second electrode layer 20. A refractive index n1 of the first light-coupling layer 411 may be larger than a refractive index n2 of the second light-coupling layer 412 in a same light-coupling stacked layer 41. In other words, along the light-emitting direction of the organic light-emitting display panel, in a same light-coupling stacked layer 41, the light-coupling layer having a high refractive index may be closer to the organic light-emitting material layer 30 than the light-coupling layer having a low refractive index.

Referring to FIG. 5, in the light-coupling stacked layer 41, the refractive index of the first light-coupling layer 411 may be larger than the refractive index of the second light-coupling layer 412. Referring to FIG. 6, in the light-coupling stacked layer 41A, the refractive index of the first light-coupling layer 411A may be larger than the refractive index of the second light-coupling layer 412A. In the light-coupling stacked layer 41B, the refractive index of the first light-coupling layer 411B may be larger than the refractive index of the second light-coupling layer 412B. In the light-coupling stacked layer 41C, the refractive index of the first light-coupling layer 411C may be larger than the refractive index of the second light-coupling layer 412C.

In one embodiment, as shown in FIG. 6 the light-coupling layer group 40 may include a plurality of light-coupling stacked layers 41A/41B/41C successively disposed along the first direction 'α'. For adjacent groups of the first light-coupling layer and the second light-coupling layer along the first direction 'a', not only the refractive indices of the first light-coupling layer 411A (or 411B or 411C) and the second light-coupling layer 412A (or 412B or 412C) in the same light-coupling stacked layer 41A (or 41B or 41C) may be different, but also the refractive indices of the first light-coupling layer and the second light-coupling layer in different light-coupling stacked layers may be different. For example, the second light-coupling layer 412A may have a refractive index different from the first light-coupling layer 411B, and the second light-coupling layer 412B may have a refractive index different from the first light-coupling layer 411C. The present disclosure does not limit the values of the refractive indices of the first light-coupling layer and the second light-coupling layer in different light-coupling stacked layers. By providing the first light-coupling layer and the second light-coupling layer having different refractive indices in different light-coupling stacked layers, the probability of light refraction in the light-coupling layer group 40 may increase, thereby improving the light-emission efficiency of the organic light-emitting display panel.

Referring to FIG. 5, light L2 generated by the organic light-emitting material layer 30 may be incident on the first light-coupling layer 411 through the second electrode layer 20, and refracted once at the interface between the second electrode layer 20 and the first light-coupling layer 411. The incidence angle α of the light L2 incident on the second light-coupling layer 412 from the first light-coupling layer 411 may be equal to arcsin (n2/n1), and the emission angle β may be equal to 90 degrees.

Light L1 generated by the organic light-emitting material layer 30 may be incident on the first light-coupling layer 411 directly through the second electrode layer 20, and refracted once at the interface between the second electrode layer 20 and the first light-coupling layer 411. The incidence angle of the light L1 incident on the second light-coupling layer 412 from the first light-coupling layer 411 may be smaller than a, such that the light L1 may be refracted in the second light-coupling layer 412 and then be emitted.

Light L3 generated by the organic light-emitting material layer 30 may re-enter the organic light-emitting material layer 30 after being reflected by the first electrode layer 10, and may be incident on the second electrode layer 20. Then, the light L3 may be incident on the first light-coupling layer 411 after passing through the second electrode layer 20, and refracted once at the interface between the second electrode layer 20 and the first light-coupling layer 411. The incidence angle of the light L3 incident on the second light-coupling layer 412 from the first light-coupling layer 411 may be smaller than a, such that light L3 may be refracted in the second light-coupling layer 412 and then be emitted.

Light L4 generated by the organic light-emitting material layer 30 may be directly incident on the first light-coupling layer 411 through the second electrode layer 20, and refracted once at the interface between the second electrode layer 20 and the first light-coupling layer 411. The incidence angle of the light L4 incident on the second light-coupling layer 412 after passing the first light-coupling layer 411 may be larger than a. In one embodiment, the light L4 may be ultimately emitted after being transmitted through the second light-coupling layer 412 by configuring a substantially small thickness of the second light-coupling layer 412.

The optical path of light in the light-coupling layer group 40 illustrated in FIG. 5 is for illustrative purposes, and is not intended to limit the scope of the present disclosure. In another embodiment, as shown in FIG. 6, light may be refracted at the interface of every two adjacent light-coupling layers with different refractive indices. Similar to FIG. 5, in FIG. 6, light may be emitted after being refracted and transmitted through the second light-coupling layer 412C which is farthest away from the second electrode layer 20, and the process is not repeated herein.

In the disclosed embodiments, the first light-coupling layer 411 and the second light-coupling layer 412 may be provided in the display panel. On one hand, light that is entirely reflected in the first light-coupling layer 411 (the light-coupling layer having a high refractive index) may be conveniently reduced by increasing the difference between the refractive index n1 of the first light-coupling layer 411 and the refractive index n2 of the second light-coupling layer 412. In other words, light that is entirely reflected in the first light-coupling layer 411 may be reduced by reducing the value of the refraction critical angle arcsin (n2/n1) at the interface between the first light-coupling layer 411 and the second light-coupling layer 412 without changing other film layers of the organic light-emitting display panel.

Therefore, the light-emission efficiency of the organic light-emitting display panel may be improved, and may not be limited by the film layers of the organic light-emitting display panel. The disclosed organic light-emitting display panel may have high flexibility, and may break through the bottleneck that the light-emission efficiency of the organic light-emitting display panel is limited by the film layers.

On the other hand, the thickness of the light-coupling layer may be set in a range of approximately tens to hundreds of nanometers, such that light having an incidence angle larger than the refraction critical angle of arcsin (n2/n1) at the interface between the first light-coupling layer 411 and the second light-coupling layers 412 may be emitted after being transmitted. Therefore, light that is totally internally reflected in the light-coupling layer having a high refractive index may be further reduced. Further, referring to FIG. 5, light emitted from the first light-coupling layer 411 from different angles may be well emitted after passing through the second light-coupling layer 412.

To verify the technical effects of the present disclosure, models are respectively built by finite difference time-domain (FDTD) for the organic light-emitting display panel in the prior art and the disclosed organic light-emitting display panel. To clarify the technical effects of the present disclosure, a model of another organic light-emitting display panel is also provided as a control experiment.

In one embodiment, a first model M1 is configured for the disclosed organic light-emitting display panel, a second model M2 is configured for the organic light-emitting display panel in the prior art, and a third model M3 is configured for the control organic light-emitting display panel. The part for realizing light-coupling extraction in the first model M1 may include the first light-coupling layer and the second light-coupling layer, and the second light-coupling layer may be above the first light-coupling layer when the light-emitting direction is upward. The part for realizing light-coupling extraction in the second model M2 may include the first light-coupling layer. The part for realizing light-coupling extraction in the third model M3 may include the first light-coupling layer and the second light-coupling layer, and the first light-coupling layer may be above the second light-coupling layer when the light-emitting direction is upward. The structures and materials of the other film layers in the three models may be the same. The experiment is divided into five groups. In the five groups of experiment, the refractive indices of the first light-coupling layer may be 1.6, 1.8, 2.0, 2.2 and 2.4, respectively, and the refractive index of the second light-coupling layer may be fixed as 1.3.

Figure 7:
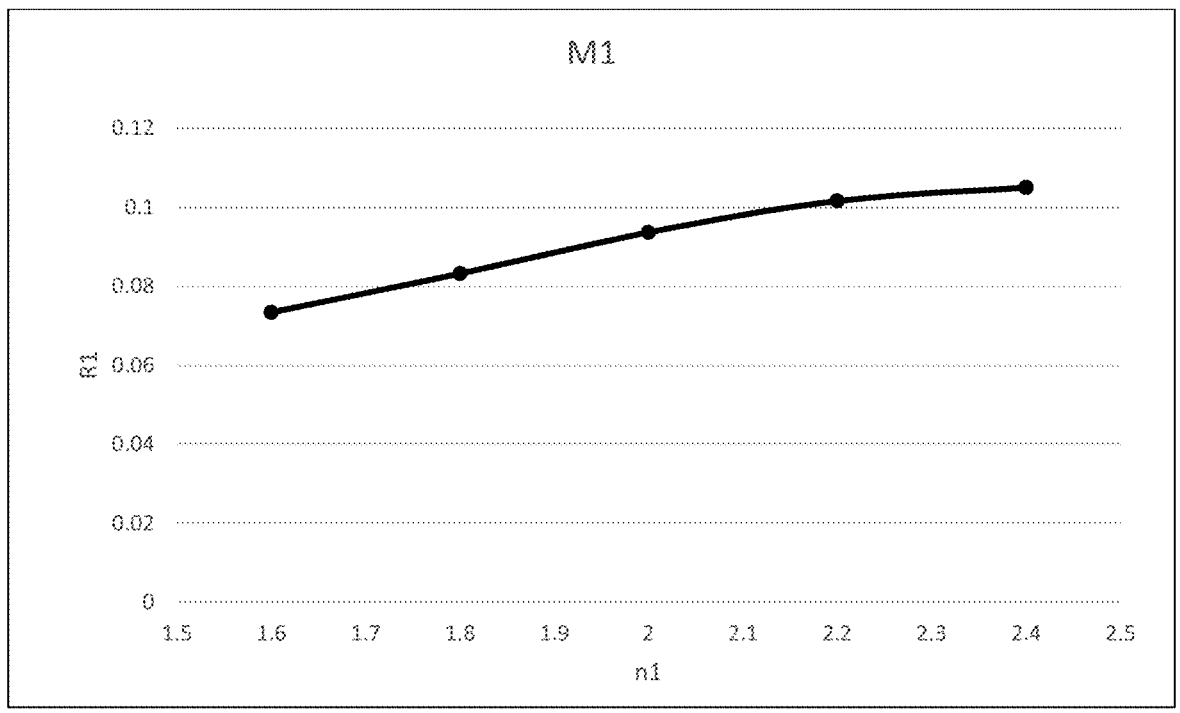
FIG. 7 illustrates a relation chart of device peak intensity versus refractive index of an exemplary organic light-emitting display panel consistent with disclosed embodiments of the present disclosure.
Figure 8:
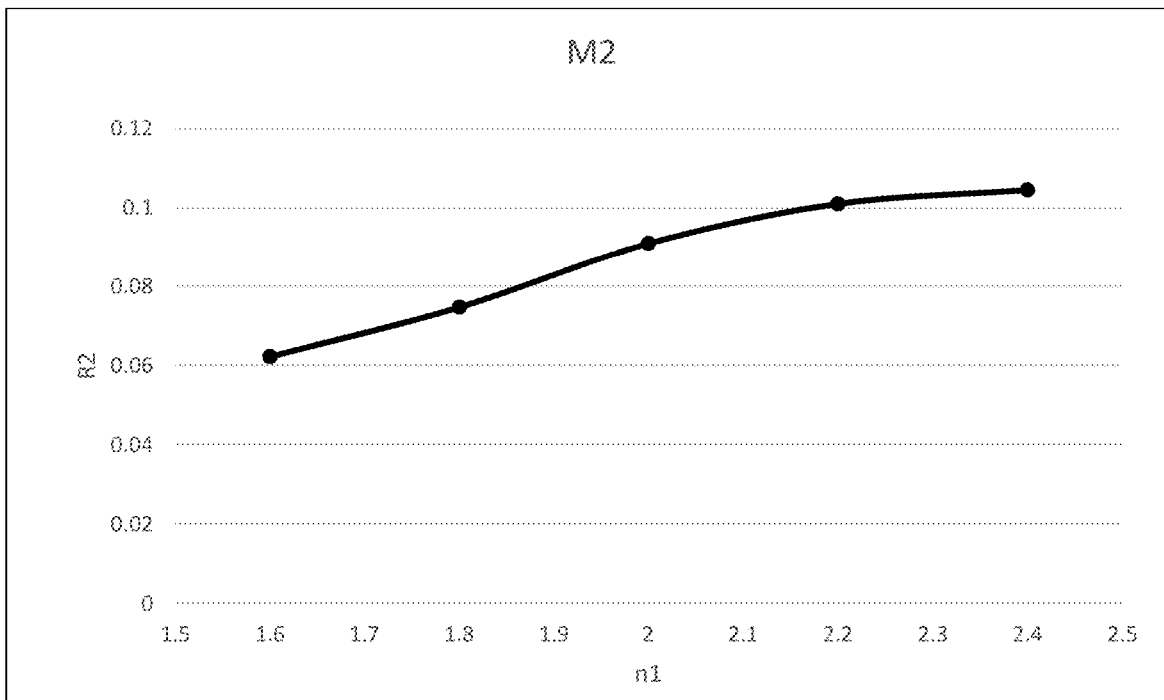
FIG. 8 illustrates a relation chart of device peak intensity versus refractive index of an existing organic light-emitting display panel.

FIG. 7 illustrates a relation chart of device peak intensity versus refractive index of an exemplary organic light-emitting display panel consistent with disclosed embodiments of the present disclosure; FIG. 8 illustrates a relation chart of device peak intensity versus refractive index of an existing organic light-emitting display panel; and FIG. 9 illustrates a relation chart of device peak intensity versus refractive index of a control organic light-emitting display panel.

Figure 9:
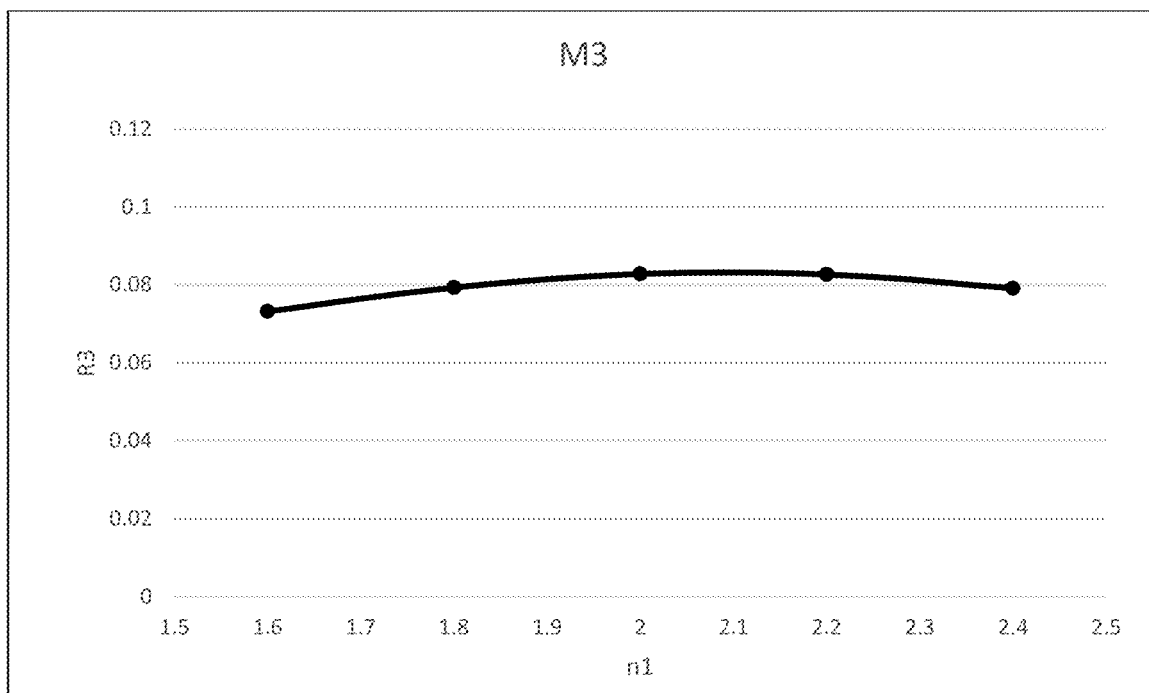
FIG. 9 illustrates a relation chart of device peak intensity versus refractive index of a control organic light-emitting display panel.

In FIGS. 7-9, the ordinates are the peak intensities R1, R2, and R3 of green devices in the first model M1, the second model M2 and the third model M3, respectively, and the units are luminous intensities (a.u.). The greater the peak intensity of the device, the greater the light-emission efficiency of the device. Therefore, the light-emission efficiency of the organic light-emitting display panel may be expressed by the peak intensity R of the device. The abscissas are the refractive index n1 of the first light-coupling layer, respectively.

Comparing FIG. 7 and FIG. 8, in the experiment where the refractive index of the first light-coupling layer is 1.6, the peak intensity R1 of the green device in the first model M1 may be greater than 0.07 a.u., and the peak intensity R2 of the green device in the second model M2 may be about 0.06 a.u. In the experiment where the refractive index of the first light-coupling layer is 1.8, the peak intensity R1 of the green device in the first model M1 may be greater than 0.08 a.u., and the peak intensity R2 of the green device in the second model M2 may be smaller than 0.08 a.u. In each experiment where the refractive index of the first light-coupling layer is 2.0, 2.2 and 2.4, respectively, the peak intensity R1 of the green device in the first model M1 may be greater than the peak intensity R2 of the green device in the second model M2.

Figure 10:
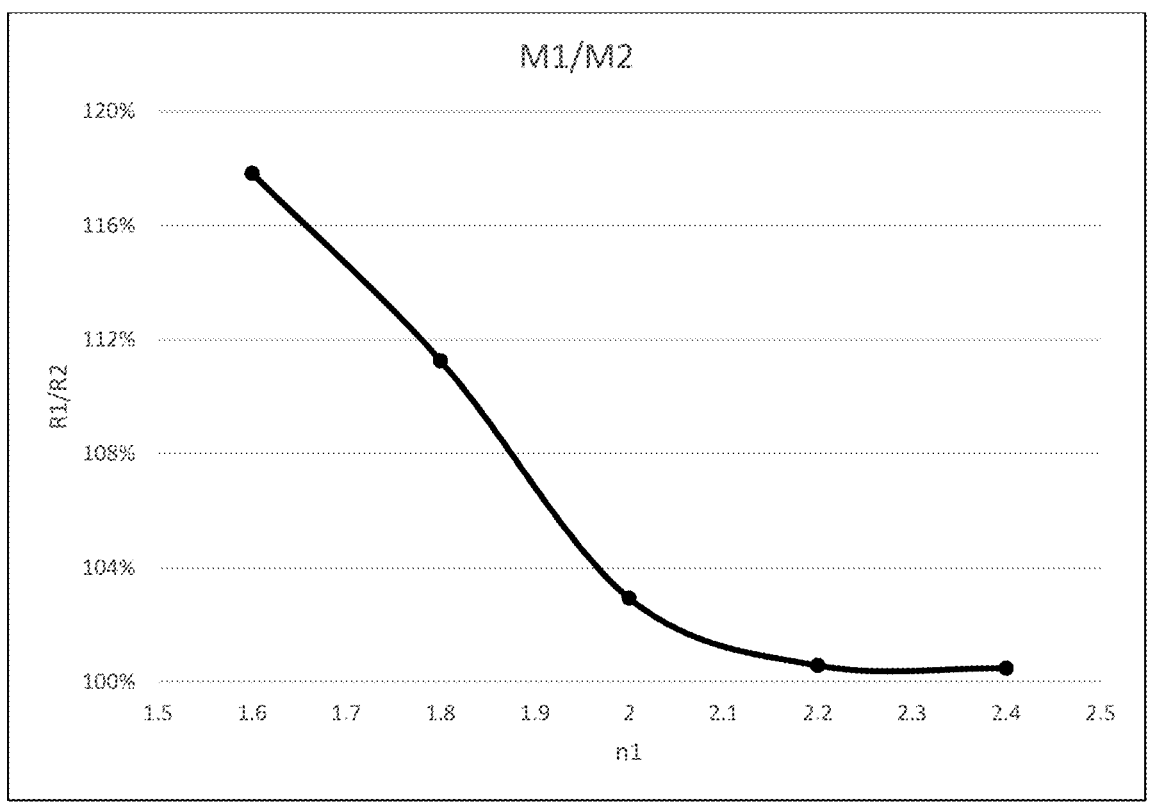
FIG. 10 illustrates a relation chart of a ratio of device peak intensity of an exemplary organic light-emitting display panel over device peak intensity of an existing organic light-emitting display panel versus refractive index.

FIG. 10 illustrates a relation chart of a ratio of device peak intensity of an exemplary organic light-emitting display panel over device peak intensity of an existing organic light-emitting display panel versus refractive index. Referring to FIG. 10, in the five groups of experiment, the ratio of the peak intensity R1 of the green device in the first model M1 over the peak intensity R2 of the green device in the second model M2 may be greater than 1. Referring to FIGS. 7, 8 and 10, the light emitting-efficiency of the disclosed organic light-emitting display panel is superior to that of the organic light-emitting display panel in the prior art.

Comparing FIG. 7 and FIG. 9, in the experiment where the refractive index of the first light-coupling layer is 2.4, the peak intensity R1 of the green device in the first model M1 may be greater than 0.1 a.u., and the peak intensity R3 of the green device in the third model M3 may be about 0.08 a.u. In the experiment where the refractive index of the first light-coupling layer is 2.2, the peak intensity R1 of the green device in the first model M1 may be about 0.1 a.u., and the peak intensity R3 of the green device in the third model M3 may be about 0.08 a.u. In each experiment where the refractive index of the first light-coupling layer is 2.0, 1.8 and 1.6, respectively, the peak intensity R1 of the green device in the first model M1 may be greater than the peak intensity R3 of the green device in the third model M3.

Figure 11:
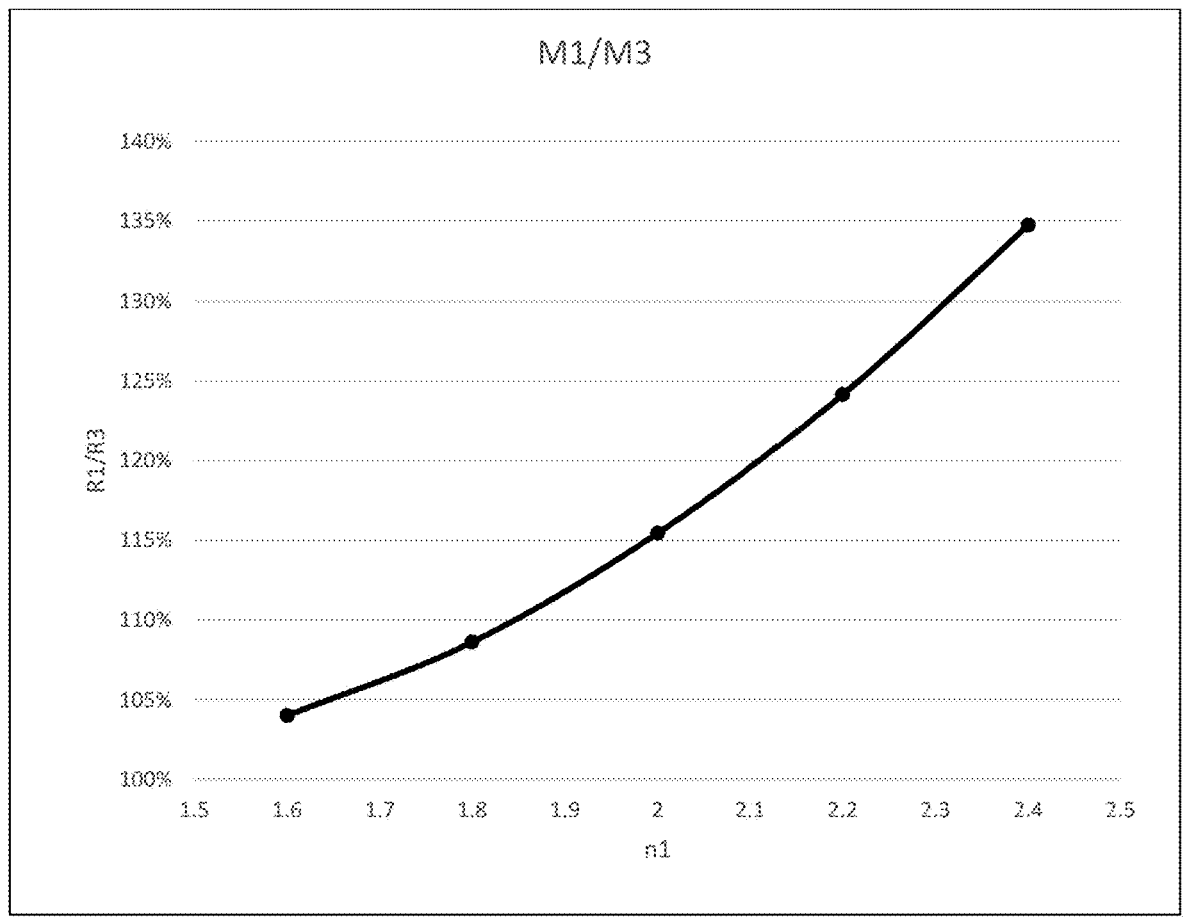
FIG. 11 illustrates a relation chart of a ratio of device peak intensity of an exemplary organic light-emitting display panel over device peak intensity of a control organic light-emitting display panel versus refractive index.

FIG. 11 illustrates a relation chart of a ratio of device peak intensity of an exemplary organic light-emitting display panel over device peak intensity of a control organic light-emitting display panel versus refractive index. Referring to FIG. 11, in the five groups of experiment, the ratio of the peak intensity R1 of the green device in the first model M1 over the peak intensity R3 of the green device in the third model M3 may be greater than 1. Referring to FIGS. 7, 9 and 11, the light-emission efficiency of the disclosed organic light-emitting display panel is superior to that of the control organic light-emitting display panel.

Based on the optical theory, total reflection may occur when light is incident on the less dense medium from the more dense medium and the incidence angle is greater than the critical angle, while total internal reflection may not occur when light is incident on the more dense medium from the less dense medium. In the control organic light-emitting display panel, the first light-coupling layer may be above the second light-coupling layer when the light-emitting direction is upward. In other words, light may first pass through the second light-coupling layer having a low refractive index, and then pass through the first light-coupling layer having a high refractive index. Accordingly, light may enter the first light-coupling layer from the second light-coupling layer without any total reflection.

Compared to the disclosed organic light-emitting display panel where light first passes through the first light-coupling layer having a high refractive index and then passes through the second light-coupling layer having a low refractive index, the light-emission efficiency of the control organic light-emitting display panel should be better. However, from the above experimental data, the actual situation is opposite to what is often thought. In other words, in the idea of realizing the part of light-coupling extraction, the present disclosure overcomes the technical issues that existing theories point to.

Accordingly, in the disclosed organic light-emitting display panel, the first electrode layer 10 as the reflective electrode, the second electrode layer 20 as the semi-reflective electrode, and the organic light-emitting material layer 30 between the two electrodes, may together form the OLED micro-cavity structure. The light-coupling layer group 40 may be disposed on the light-emission side, and the light-emission efficiency of the OLED micro-cavity structure may be improved by the light-coupling layer group 40. The light-coupling layer group may include at least one light-coupling stacked layer, and the at least one light-coupling stacked layer may include two light-coupling layers having different refractive indices. The light-coupling layer having a high refractive index (the first light-coupling layer 411) may be arranged close to the organic light-emitting material layer 30, and the light emitting-efficiency of the OLED micro-cavity structure may be improved by the light-coupling layer having a low refractive index (the second light-coupling layer 412). The light-coupling layer having a low refractive index may be above the light-coupling layer having a high refractive index when the light-emitting direction is upward, such that the light emission of the light-coupling layer having a high refractive index may be further adjusted to synergistically enhance the light-emission efficiency.

In the disclosed organic light-emitting display panel, in one embodiment, the second light-coupling layer may be made of an air-gel material, including SiO air-gel. On the one hand, the air-gel may be in a solid material form and may be shaped into a film layer of the organic light-emitting display panel. During the fabrication process, the film layer may be generally formed by spraying, and the thin second light-coupling layer may be easily formed. The second light-coupling layer may have desired transmissivity and low light absorption rate. In addition, the second light-coupling layer with various shapes and structures may be easily fabricated.

On the other hand, the refractive index of the air-gel may be small. As shown in FIG. 7, the larger the difference between the refractive indices of the first light-coupling layer and the second light-coupling layer, the higher the light-emission efficiency of the organic light-emitting display panel. The second light-coupling layer made of the air-gel having small refractive index may easily ensure the difference between the refractive indices of the first light-coupling layer and the second light-coupling layer, when the first light-coupling layer is made of different materials. The improvement of the light-emission efficiency of the organic light-emitting display panel may be easily realized. In another aspect, the second light-coupling layer made of the air-gel material may have desired flexibility and may be suitable for a flexible organic light-emitting display panel.

In another embodiment, the second light-coupling layer may be made of an inorganic material. The second light-coupling layer made of inorganic material may be corrosion-resistant, capable of blocking water and oxygen, have a certain compression capability and, thus may be suitable for a rigid organic light-emitting display panel. The second light-coupling layer made of an inorganic material, such as $BaF_2$, LiF, $MgF_2$, $AlF_3$, $Na_3AlF_6$, or $Na_5Al_3F_{14}$, etc., may have a small refractive index and, thus, may enable a large difference between the refractive indices of the first light-coupling layer and the second light-coupling layer. Therefore, the light-emission efficiency of the organic light-emitting display panel may be improved.

In certain embodiments, both the first light-coupling layer and the second light-coupling layer may be made of organic materials, such as polysilane, polysiloxane, acrylic or polycarbonate, etc. The organic materials may have a low cost, small light absorption capacity, and easily controllable shape, such that the first light-coupling layer and the second light-coupling layer with various shapes and structures may be easily fabricated.

In one embodiment, referring to FIG. 5, a thickness of the first light-coupling layer may be in a range of approximately 10 nm-1000 nm, and a thickness 'd2' of the second light-coupling layer may be in a range of approximately 10 nm-1000 nm. In practical applications, the thickness of the first light-coupling layer and the second light-coupling layer may be determined according various application scenarios.

Under the premise of easy control of process parameters and precision, the first light-coupling layer and the second light-coupling layer may be made to be less than 1 μm. Thus, the light absorption of the first light-coupling layer and the second light-coupling layer may be reduced, and the proportion of light that is totally internally reflected when entering the second light-coupling layer from the first light-coupling layer may be reduced. In other words, the light, which has an incidence angel greater than the critical angle and cannot enter the second light-coupling layer by refraction, may enter the second light-coupling layer by transmission as much as possible. Thus, the total internal reflection may be reduced, and the light-emission efficiency of the organic light-emitting display panel may be improved accordingly.

In one embodiment, the refractive index of the first light-coupling layer may be greater than or equal to 1.5. When light is incident on the first light-coupling layer having a refractive index greater than or equal to 1.5 from the semi-reflective electrode, in other words, when light is incident on the more dense medium from the less dense medium, more light may perpendicularly enter the first light-coupling layer when the light is being refracted, such that the light-emission efficiency of the organic light-emitting display panel may be improved, and light loss caused by multiple refraction and reflection in the panel may be reduced.

In one embodiment, in the same light-coupling stacked layer, a difference between the refractive index of the first light-coupling layer and the refractive index of the second light-coupling layer may be greater than or equal to 0.1 and less than or equal to 2.5. As shown in FIG. 7, given the fixed refractive index of the second light-coupling layer, the higher the refractive index of the first light-coupling layer, the higher the light-emission efficiency of the organic light-emitting display panel. Therefore, through configuring the difference between the refractive index of the first light-coupling layer and the refractive index of the second light-coupling layer to be above 0.1, the difference between the refractive index of the first light-coupling layer and the refractive index of the second light-coupling layer may be ensured and, accordingly, the light-emission efficiency of the organic light-emitting display panel may be improved. Through configuring the difference between the refractive index of the first light-coupling layer and the refractive index of the second light-coupling layer to be less than 2.5, the fabrication of the first light-coupling layer and the second light-coupling layer by common materials may be facilitated, such that the cost of the organic light-emitting display panel may be reduced.

In one embodiment, the contact surface of the first light-coupling layer and the second light-coupling layer in a same light-coupling stacked layer may be a planar surface, a curved surface or a beveled surface, etc. In another embodiment, the first light-coupling layer and the second light-coupling layer may be embedded into each other. When the first light-coupling layer and the second light-coupling layer are embedded into each other, a portion of or the entire second light-coupling layer may be embedded into the first light-coupling layer along the light-emitting direction.

When the first light-coupling layer and the second light-coupling layer are embedded into each other, portion of the first light-coupling layer may be under the second light-coupling layer along the light-emitting direction. In an extreme case, when the portion of the first light-coupling layer under the second light-coupling layer is extremely thin, the first light-coupling layer may be entirely embedded into the second light-coupling layer.

When the first light-coupling layer and the second light-coupling layer are embedded into each other, the portions where the first light-coupling layer and the second light-coupling layer are embedded into each other may be a micro-structure (invisible to the naked eye) or a macro-structure (visible to the naked eye). The details of the contact surface of the first light-coupling layer and the second light-coupling layer include the following.

In one embodiment, in the same light-coupling stacked layer, as shown in FIG. 5 and FIG. 3, the contact surface of the first light-coupling layer 411 and the second light-coupling layer 412 may be a planar surface. The light-coupling stacked layer in the organic light-emitting display panel illustrated in FIG. 5 may be easily realized and shaped.

In one embodiment, in the same light-coupling stacked layer, the second light-coupling layer may be entirely embedded in the first light-coupling layer along the light-emitting direction. A corresponding structure is shown in FIG. 12.

Figure 12:
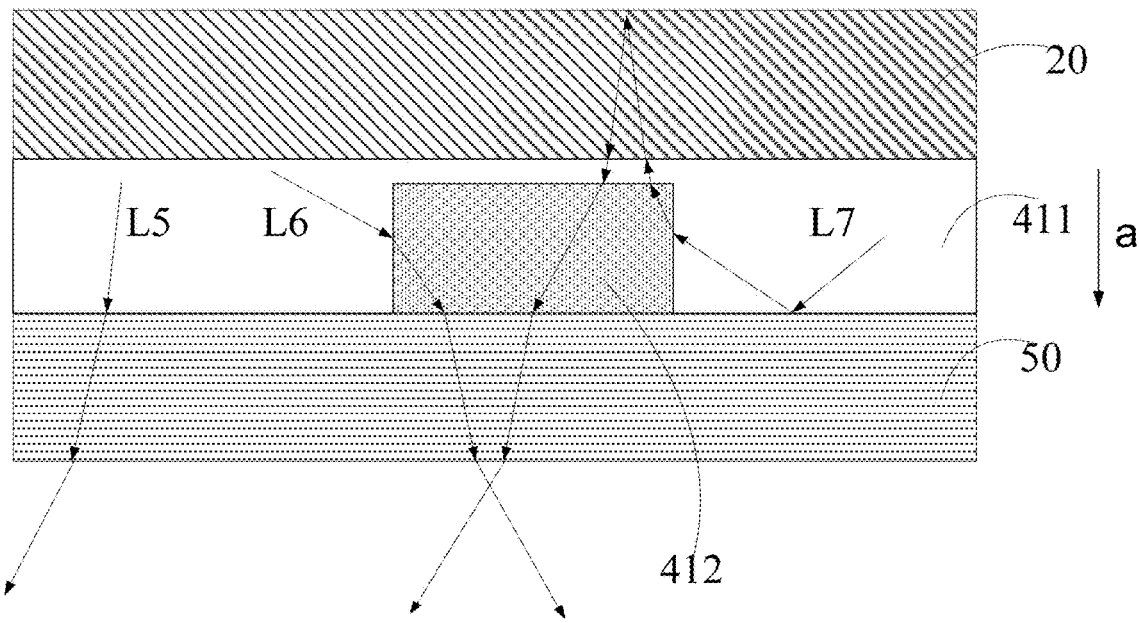
FIG. 12 illustrates an optical path of a light-coupling stacked layer of an exemplary organic light-emitting display panel consistent with disclosed embodiments of the present disclosure.

FIG. 12 illustrates an optical path of a light-coupling stacked layer of an exemplary organic light-emitting display panel consistent with disclosed embodiments of the present disclosure. Referring to FIG. 12, the organic light-emitting display panel may include a second electrode layer 20, a first light-coupling layer 411, a second light-coupling layer 412 and a film layer 50. For the top-emission type organic light-emitting display panel, the film layer 50 may be an encapsulation layer. For the bottom-emission type organic light-emitting display panel, the film layer 50 may be a substrate. When the film layer 50 is the substrate, the thin-film-transistor layer is omitted in the FIG. 12. The organic light-emitting display panel may also include a first electrode layer and an organic light-emitting material layer (not illustrated in FIG. 12).

Referring to FIG. 12, in the organic light-emitting display panel, the second light-coupling layer 412 may be entirely embedded in the first light-coupling layer 411 along the light-emitting direction. A portion of light L5 entering the first light-coupling layer 411 after passing through the second electrode layer 20 may be incident on the position where the second light-coupling layer 412 is not disposed, and then light L5 may directly enter the film layer 50 and be emitted without passing through the second light-coupling layer 412. A portion of light L6 entering the first light-coupling layer 411 after passing through the second electrode layer 20 may be incident on the position where the second light-coupling layer 412 is disposed. Then the light L6 may be incident on the film layer 50 and then be emitted after successively passing through the interface between the second light-coupling layer 412 and the first light-coupling layer 411, as well as, the interface between the second light-coupling layer 412 and the film layer 50.

A portion of light L7 entering the first light-coupling layer 411 after passing through the second electrode layer 20 may be incident on the position where the second light-coupling layer 412 is not disposed. Then the light L7 may be totally internally reflected at the interface between the first light-coupling layer 411 and the film layer 50. Then, the light L7 may successively pass through the interface between the second light-coupling layer 412 and the first light-coupling layer 411 twice and then prorogate back to the second electrode layer 20. Later, the light L7 may be incident on the second electrode layer 20 after being reflected by the first electrode layer (not illustrated), and then re-enter the first light-coupling layer 411. The light re-entering the first light-coupling layer 411 may be incident on the film layer 50 and be emitted after successively passing through the interface between the second light-coupling layer 412 and the first light-coupling layer 411, as well as, the interface between the second light-coupling layer 412 and the film layer 50.

Figure 13:
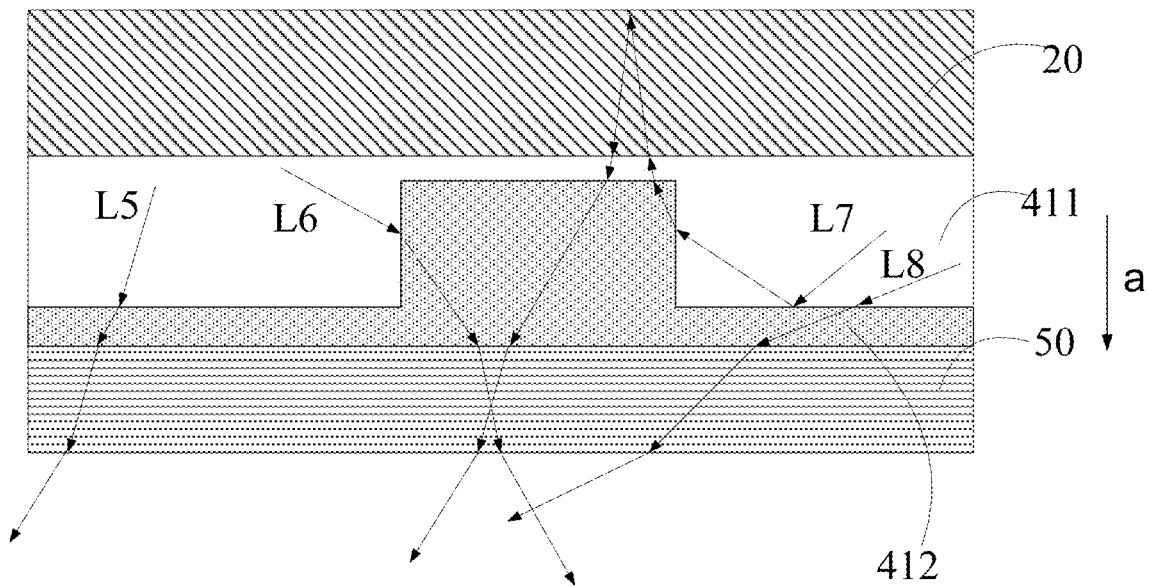
FIG. 13 illustrates an optical path of a light-coupling stacked layer of another exemplary organic light-emitting display panel consistent with disclosed embodiments of the present disclosure.

In one embodiment, in the same light-coupling stacked layer, the second light-coupling layer may be partially embedded in the first light-coupling layer along the light-emitting direction. FIG. 13 illustrates an optical path of a light-coupling stacked layer of another exemplary organic light-emitting display panel consistent with disclosed embodiments of the present disclosure. Referring to FIG. 13, the organic light-emitting display panel may include a second electrode layer 20, a first light-coupling layer 411, a second light-coupling layer 412 and a film layer 50. For the bottom-emission type organic light-emitting display panel, the film layer 50 may be a substrate. When the film layer 50 is the substrate, the thin-film-transistor layer is omitted in the FIG. 13. The organic light-emitting display panel may also include a first electrode layer and an organic light-emitting material layer (not illustrated in FIG. 13).

Referring to FIG. 13, in the organic light-emitting display panel, the second light-coupling layer 412 may be partially embedded in the first light-coupling layer 411 along the light-emitting direction. All the light entering the film layer 50 may pass through the second light-coupling layer 412. A portion of light L5 entering the first light-coupling layer 411 after passing through the second electrode layer 20 may be incident on the film layer 50, and then emitted after successively being refracted at the interface between the second light-coupling layer 412 and the first light-coupling layer 411, as well as, the interface between the second light-coupling layer 412 and the film layer 50.

A portion of light L6 entering the first light-coupling layer 411 after passing through the second electrode layer 20 may be incident on the film layer 50, and then emitted after successively passing through the interface between the second light-coupling layer 412 and the first light-coupling layer 411, as well as, the interface between the second light-coupling layer 412 and the film layer 50.

A portion of light L7 entering the first light-coupling layer 411 after passing through the second electrode layer 20 may be totally internally reflected at the interface between the first light-coupling layer 411 and the second light-coupling layer 412. Then, the light L7 may successively pass through the interface between the second light-coupling layer 412 and the first light-coupling layer 411 twice, and then prorogate back to the second electrode layer 20. Later, the light L7 may be incident on the second electrode layer 20 after being reflected by the first electrode layer (not illustrated), and then re-enter the first light-coupling layer 411. The light re-entering the first light-coupling layer 411 may be incident on the film layer 50, and then emitted after successively passing through the interface between the second light-coupling layer 412 and the first light-coupling layer 411, as well, as the interface between the second light-coupling layer 412 and the film layer 50.

A portion of light L8 entering the first light-coupling layer 411 after passing through the second electrode layer 20 may be transmitted through the second light-coupling layer 412, incident on the film layer 50 and emitted after being refracted at the interface between the second light-coupling layer 412 and the film layer 50.

Referring to the optical paths illustrated in FIG. 12 and FIG. 13, the area of the contact surface of the first light-coupling layer and the second light-coupling layer may increase by embedding the first light-coupling layer and the second light-coupling layer into each other with respect to the case where the contact surface of the first light-coupling layer and the second light-coupling layer is a planar surface. After light is reflected at the interfaces between the first light-coupling layer, the second light-coupling layer and the film layer, the light may ultimately enter the film layer 50 and be emitted through a plurality of times of refraction, such that the light-emission efficiency of the organic light-emitting display panel may be further improved.

In addition, for the embodiment in which the second light-coupling layer is partially embedded into the first light-coupling layer, on one hand, a first portion of the second light-coupling layer that is embedded into the first light-coupling layer may increase the contact area of the first light-coupling layer and the second light-coupling layer. On the other hand, a second portion of the second light-coupling layer that is not embedded into the first light-coupling layer may ensure that all the light enters the film layer through the second light-coupling layer. When the refractive index of the second light-coupling layer is smaller than the refractive index of the film layer, compared to the case where the first light-coupling layer is in direct contact with the film layer, the amount of light that is totally reflected at the interface between the first light-coupling layer and the second light-coupling layer may be less than the amount of light that is totally reflected at the interface between the first light-coupling layer and the film layer.

In another aspect, a thickness of the first portion of the second light-coupling layer that is embedded into the first light-coupling layer may be greater than a thickness of the second portion of the second light-coupling layer that is not embedded into the first light-coupling layer. The first portion of the second light-coupling layer having a larger thickness may increase the contact area of the second light-coupling layer and the first light-coupling layer as much as possible. The second portion of the second light-coupling layer having a smaller thickness may enable more light having an incidence angle greater than the refraction critical angle to be transmitted through the second light-coupling layer and enter the film layer.

The portions where the first light-coupling layer and the second light-coupling layer are embedded into each other may be a micro-structure or a macro-structure with a sufficient magnification.

In one embodiment, the first light-coupling layer may have a first surface facing the second light-couple layer and an opposing second surface far away from the second light-couple layer. The first surface of the first light-coupling layer may include a plurality of micro-trench structures, and the second light-coupling layer may be at least partially embedded into a micro-trench structure. By providing the micro-trench structure, the area of the contact surface between the first light-coupling layer and the second light-coupling layer may further increase, and the light-emission efficiency of the organic light-emitting display panel may be improved. The case where the second light-coupling layer is at least partially embedded into the micro-trench structure may include two situations: the second light-coupling layer is entirely embedded into the micro-trench structure; and the second light-coupling layer is partially embedded into the micro-trench structure. The details may be referred to the corresponding descriptions associated with FIG. 12 and FIG. 13, and are not repeated herein.

In the same light-coupling stacked layer, the plurality of micro-trench structures may be randomly or regularly distributed on the first surface. A cross-section of the micro-trench structure may have a semicircular shape, or a polygonal shape, etc. The cross-section may be perpendicular to the plane where the light-emitting material layer is located and the first surface. The case where the second light-coupling layer is embedded into the microstructure of the first light-coupling layer is described in detail as follows.

Figure 14:
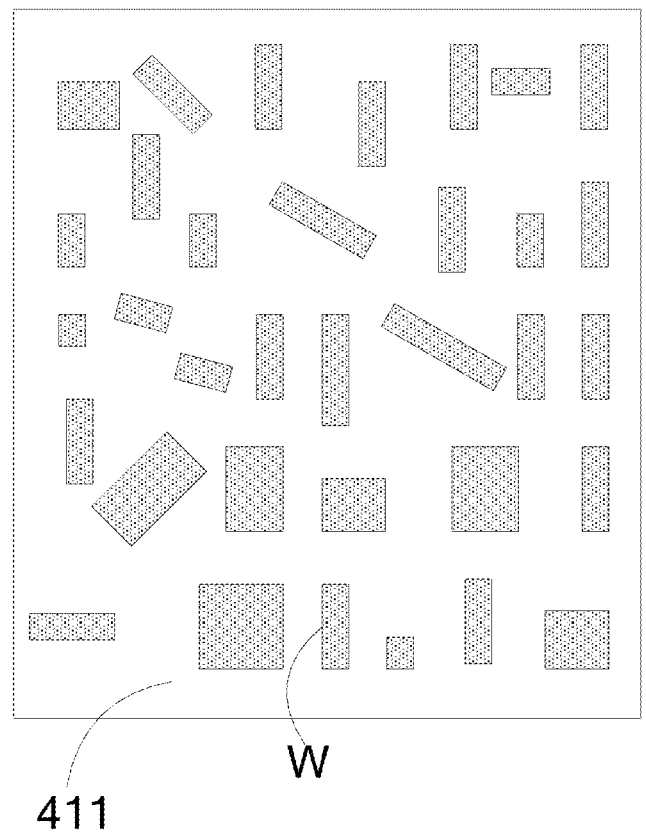
FIG. 14 illustrates a schematic top view of an exemplary light-coupling stacked layer in an exemplary organic light-emitting display panel consistent with various disclosed embodiments of the present disclosure.

FIG. 14 illustrates a schematic top view of an exemplary light-coupling stacked layer in an exemplary organic light-emitting display panel consistent with various disclosed embodiments of the present disclosure. In one embodiment, referring to FIG. 14, a plurality of micro-trench structures W may be provided on the first light-coupling layer 411. Respective micro-trench structures W may be randomly distributed, and the second light-coupling layer may be partially embedded into each micro-trench structure W. The light-coupling-emission capacity of the first light-coupling layer and the second light-coupling layer may be improved by the random micro-trench structures.

Figure 15:
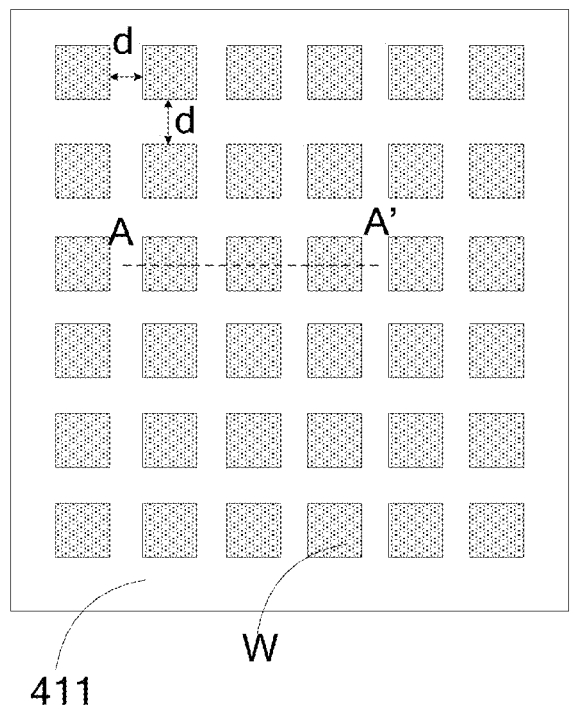
FIG. 15 illustrates a schematic top view of another exemplary light-coupling stacked layer in an exemplary organic light-emitting display panel consistent with disclosed embodiments of the present disclosure.
Figure 16:
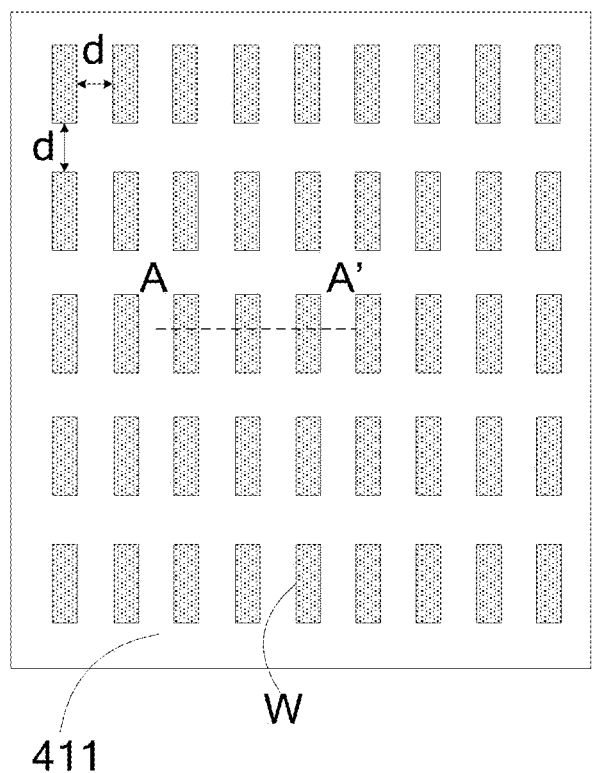
FIG. 16 illustrates a schematic top view of another exemplary light-coupling stacked layer of an exemplary organic light-emitting display panel consistent with disclosed embodiments of the present disclosure.
Figure 17:
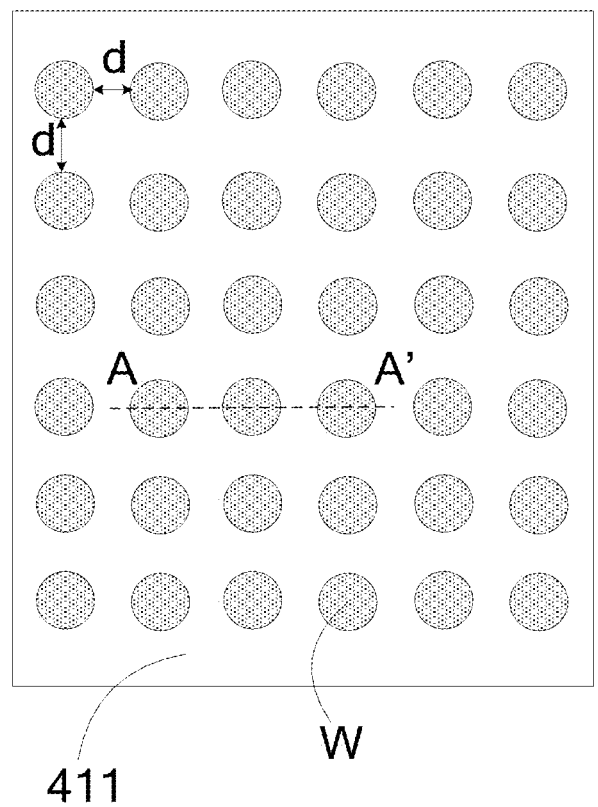
FIG. 17 illustrates a schematic top view of another exemplary light-coupling stacked layer of an exemplary organic light-emitting display panel consistent with disclosed embodiments of the present disclosure.

FIGS. 15-17 illustrate schematic top views of an exemplary light-coupling stacked layer in an exemplary organic light-emitting display panel consistent with disclosed embodiments of the present disclosure. Referring to FIGS. 15-17, a plurality of micro-trench structures W may be provided on the first light-coupling layer 411, and respective micro-trench structures may be arranged in an array to facilitate the fabrication of the light-coupling stacked layer. The second light-coupling layer may be partially embedded into each micro-trench structure W. In an observation from a viewing angle perpendicular to the organic light-emitting display panel, in one embodiment, a top-view shape of each micro-trench structure may be a square as shown in FIG. 15.

In another embodiment, a top-view shape of each micro-trench structure may be a rectangular as shown in FIG. 16. In certain embodiments, a top-view shape of each micro-trench structure may be a circle as shown in FIG. 17. The top-view shape of each micro-trench structure may be other shapes, such as a trapezoid or an irregular shape, and is not limited in the present disclosure.

In one embodiment, in any one of disclosed organic light-emitting display panels, referring to FIGS. 14-17, a distance 'd' between two adjacent micro-trench structures may be in a range of approximately 200 nm-5 μm. On one hand, the process parameters of the micro-trench structure may be easily and precisely controlled by configuring the distance 'd' larger than 200 nm. When forming the first light-coupling layer and the second light-coupling layer that are embedded into each other through the micro-trench structures, the process conditions and the production cost may be reduced. On the other hand, the first light-coupling layer and the second light-coupling layer that are embedded into each other through the micro-trench structures may have a large contact surface by configuring the distance smaller than 5 μm, thus light in respective directions refracted at the interface between the first light-coupling layer and the second light-coupling layer may be facilitated.

Figure 18:
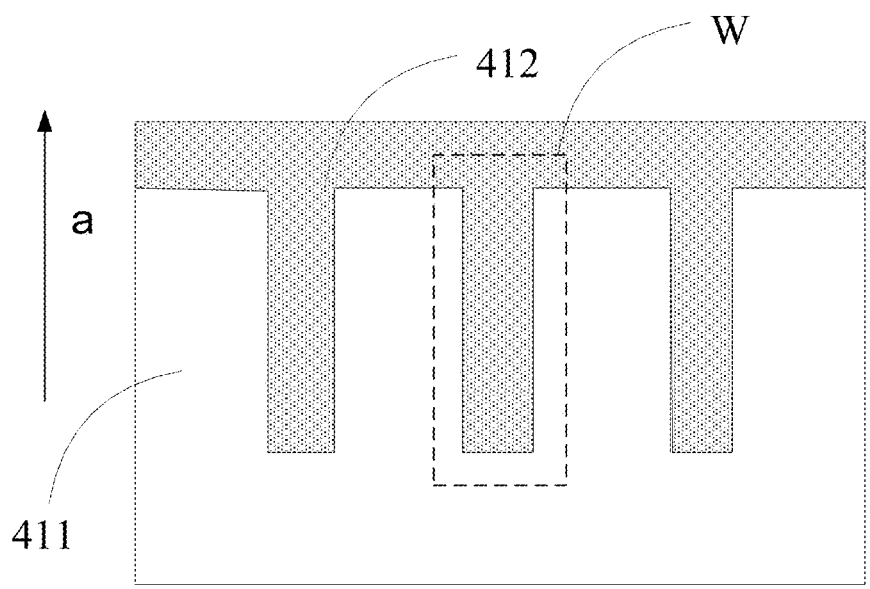
FIG. 18 illustrates a schematic cross-sectional view of an exemplary light-coupling stacked layer in an exemplary organic light-emitting display panel consistent with disclosed embodiments of the present disclosure.

FIG. 18 illustrates a schematic cross-sectional view of an exemplary light-coupling stacked layer in an exemplary organic light-emitting display panel consistent with disclosed embodiments of the present disclosure. In one embodiment, the cross-section illustrated in FIG. 18 may be a cross-section obtained along any cutting lines A-A' illustrated in FIGS. 15-17.

Referring to FIG. 18, the cross-section of each micro-trench structure W may have a rectangular shape. When the cross-section illustrated in FIG. 18 is a cross-section obtained along the cutting line A-A' illustrated in FIG. 15, a three dimensional shape of the micro-trench structure in the organic light-emitting display panel illustrated in FIG. 18 may have a cubic columnar structure. When the cross-section illustrated in FIG. 18 is a cross-section obtained along the cutting line A-A' illustrated in FIG. 16, the three dimensional shape of the micro-trench structure in the organic light-emitting display panel illustrated in FIG. 18 may have a rectangular columnar structure. When the cross-section illustrated in FIG. 18 is a cross-section obtained along the cutting line A-A' illustrated in FIG. 17, the three dimensional shape of the micro-trench structure in the organic light-emitting display panel illustrated in FIG. 18 may have a cylindrical structure.

For the micro-trench structure whose three-dimensional shape is a cylindrical structure, the side surface of the cylinder may form the contact surface of the first light-coupling layer and the second light-coupling layer, facilitating light in respective directions to be refracted at the contact surface of the first light-coupling layer and the second light-coupling layer.

Figure 19:
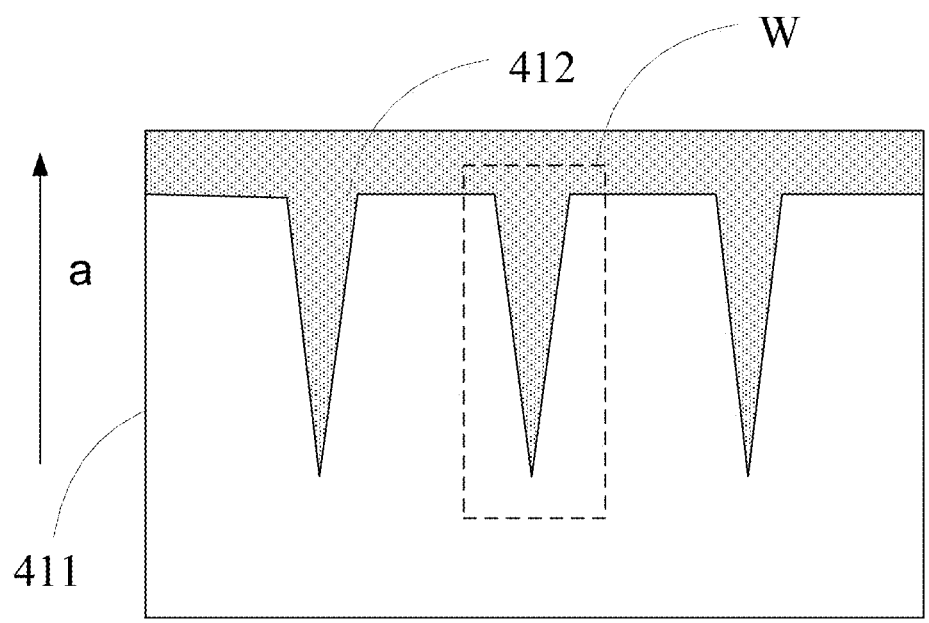
FIG. 19 illustrates a schematic cross-sectional view of another exemplary light-coupling stacked layer in an exemplary organic light-emitting display panel consistent with disclosed embodiments of the present disclosure.

FIG. 19 illustrates a schematic cross-sectional view of another exemplary light-coupling stacked layer in an exemplary organic light-emitting display panel consistent with disclosed embodiments of the present disclosure. In one embodiment, the cross-section illustrated in FIG. 19 may be a cross-section obtained along any cutting lines A-A' illustrated in FIGS. 15-17.

Referring to FIG. 19, the cross-section of each micro-trench structure W may have a triangular shape. When the cross-section illustrated in FIG. 19 is a cross-section obtained along the cutting line A-A' illustrated in FIG. 15, the three dimensional shape of the micro-trench structure in the organic light-emitting display panel illustrated in FIG. 19 may have a square pyramidal structure. When the cross-section illustrated in FIG. 19 is a cross-section obtained along the cutting line A-A' illustrated in FIG. 16, the three dimensional shape of the micro-trench structure in the organic light-emitting display panel illustrated in FIG. 19 may have a rectangular pyramidal structure. When the cross-section illustrated in FIG. 19 is a cross-section obtained along the cutting line A-A' illustrated in FIG. 17, the three dimensional shape of the micro-trench structure in the organic light-emitting display panel illustrated in FIG. 19 may have a conical structure.

For the micro-trench structure whose cross-section has a triangular shape, the bevel face where the two beveled edges of the triangle are located may form the contact surface of the first light-coupling layer and the second light-coupling layer, facilitating light in respective directions to be refracted at the contact surface of the first light-coupling layer and the second light-coupling layer.

Figure 20:
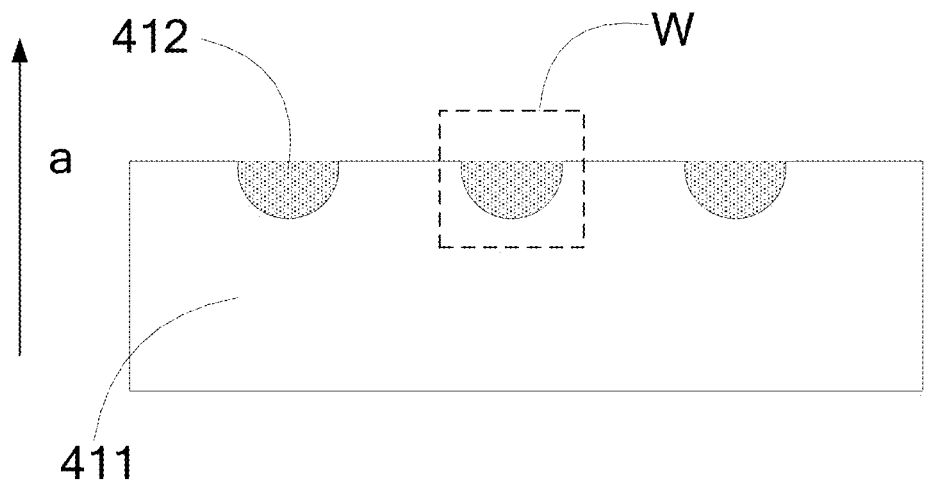
FIG. 20 illustrates a schematic cross-sectional view of another exemplary light-coupling stacked layer in an exemplary organic light-emitting display panel consistent with disclosed embodiments of the present disclosure.

FIG. 20 illustrates a schematic cross-sectional view of another exemplary light-coupling stacked layer in an exemplary organic light-emitting display panel consistent with disclosed embodiments of the present disclosure. In one embodiment, the cross-section illustrated in FIG. 20 may be a cross-section obtained along the cutting line A-A' illustrated in FIG. 17.

Referring to FIG. 20, the cross-section of each micro-trench structure W may have a semicircular shape, and the three-dimensional (3D) shape of the micro-trench structure may be a hemispherical structure. For the micro-trench structure whose 3D shape is a hemispherical structure, the spherical surface of the hemisphere may form the contact surface of the first light-coupling layer and the second light-coupling layer, facilitating light in respective directions to be refracted at the contact surface of the first light-coupling layer and the second light-coupling layer.

Figure 21:
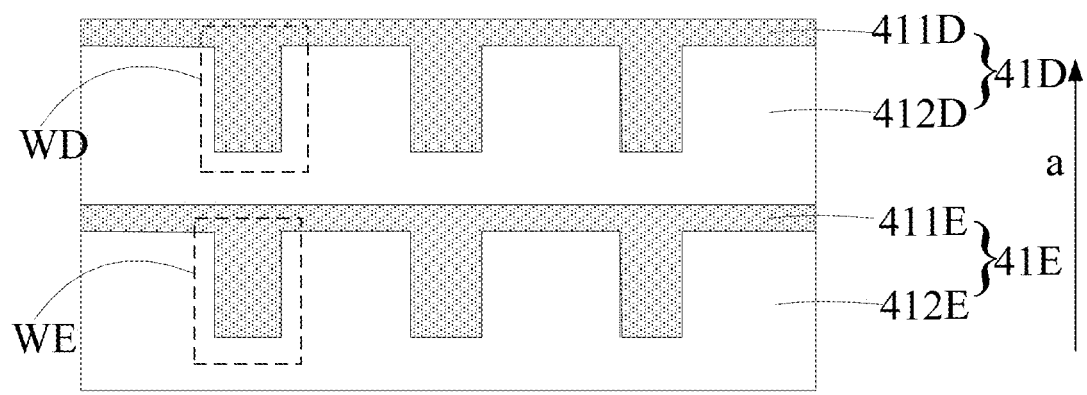
FIG. 21 illustrates a schematic cross-sectional view of another exemplary light-coupling stacked layer in an exemplary organic light-emitting display panel consistent with disclosed embodiments of the present disclosure.

FIGS. 18-20 illustrate the case where the first light-coupling layer and the second light-coupling layer are embedded into each other through the microstructure by illustrating cross-sectional views of a structure of one light-coupling stacked layer. FIG. 21 illustrates a schematic cross-sectional view of another exemplary light-coupling stacked layer in an exemplary organic light-emitting display panel consistent with disclosed embodiments of the present disclosure.

As shown in FIGS. 18-21, the organic light-emitting display panel may include a plurality of light-coupling stacked layers, such as 41D and 41E. In the light-coupling stacked layer 41D (or 41E), the first light-coupling layer 411D (or 411E) and the second light-coupling layer 412D (or 412E) may be embedded into each other by any of the above microstructures. In one embodiment, referring to FIG. 21, in the light-coupling stacked layer 41D (or 41E), the first light-coupling layer 411D (or 411E) and the second light-coupling layer 412D (or 412E) may be embedded by a manner that is the same as that illustrated in FIG. 18, where cross-section of entire the micro-trench structures W may have a rectangular shape. Different embedding methods may be respectively used in the light-coupling stacked layer 41D and the light-coupling stacked layer 41E, and are not limited in the present disclosure.

The disclosed organic light-emitting display panel may be a color display panel. In one embodiment, the light-emitting material layer may be made of a white organic light-emitting material, and a RGB color filter may be provided on the light-emitting side to realize color display. The color filter may be disposed on the side of the light-coupling layer group away from the organic light-emitting material. In another embodiment, the light-emitting material layer may include a red organic light-emitting material, a green organic light-emitting material, and a blue organic light-emitting material.

Figure 22:
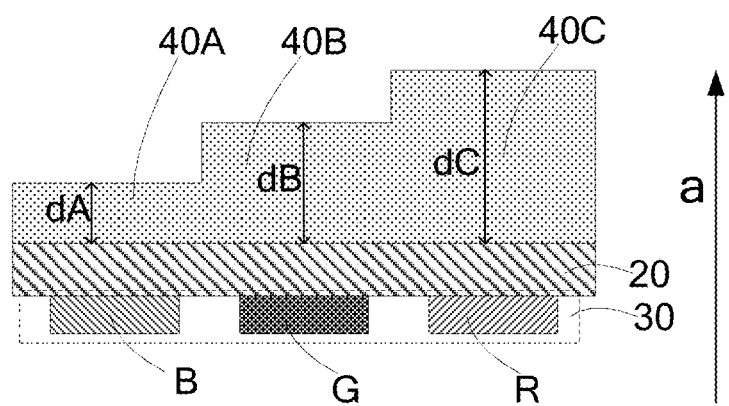
FIG. 22 illustrates a schematic diagram of film layers of another exemplary organic light-emitting display panel consistent with disclosed embodiments of the present disclosure.

FIG. 22 illustrates a schematic diagram of film layers of another exemplary organic light-emitting display panel consistent with disclosed embodiments of the present disclosure. Referring to FIG. 22, the organic light-emitting display panel may include a first electrode layer (not illustrated in FIG. 22), a second electrode layer 20, a light-coupling layer group and a light-emitting material layer 30. The light-emitting material layer 30 may include a red organic light-emitting material 'R', a green organic light-emitting material 'G', and a blue organic light-emitting material 'B'.

The light-coupling stacked layer may include a first light-coupling stacked unit 40A, a second light-coupling stacked unit 40B, and a third light-coupling stacked unit 40C. The first light-coupling stacked unit 40A, the second light-coupling stacked unit 40B and the third light-coupling stacked unit 40C may sequentially increase in thickness along the first direction 'a'. The first direction may be perpendicular to the plane where the light-emitting material layer 30 is located. An orthogonal projection of the first light-coupling stacked unit 40A onto the light-emitting material layer 30 may cover the blue organic light-emitting material 'B'. An orthogonal projection of the second light-coupling stacked unit 40B onto the light-emitting material layer 30 may cover the green organic light-emitting material 'G'. An orthogonal projection of the third light-coupling stacked unit 40C onto the light-emitting material layer 30 may cover the red organic light-emitting material 'R'.

For the red organic light-emitting material 'R', the green organic light-emitting material 'G' and the blue organic light-emitting material 'B', the order of the maximum emission peak positions of the light emission may be: $\lambda_R > \lambda_G > \lambda_B$. To respectively enhance the light-emission intensity of the red, green and blue organic light-emitting materials, a micro-cavity thickness of micro-cavity structure for each color may be an integer multiple of the half wavelength of its own organic light-emitting material, respectively.

After providing the light-coupling layer group, corresponding to the blue organic light-emitting material 'B', the green organic light-emitting material 'G' and the red organic light-emitting material 'R', sequentially increased the first light-coupling stacked unit 40A, the second light-coupling stacked unit 40B and the third light-coupling stacked unit 40C may be provided and matched with the size relationship of the half wavelength of the red organic light-emitting material 'R', the green organic light-emitting material 'G' and the blue organic light-emitting material 'B'. Therefore, the light-emission intensity of the organic light-emitting material may be protected from being reduced after providing the light-coupling layer group.

Figure 23:
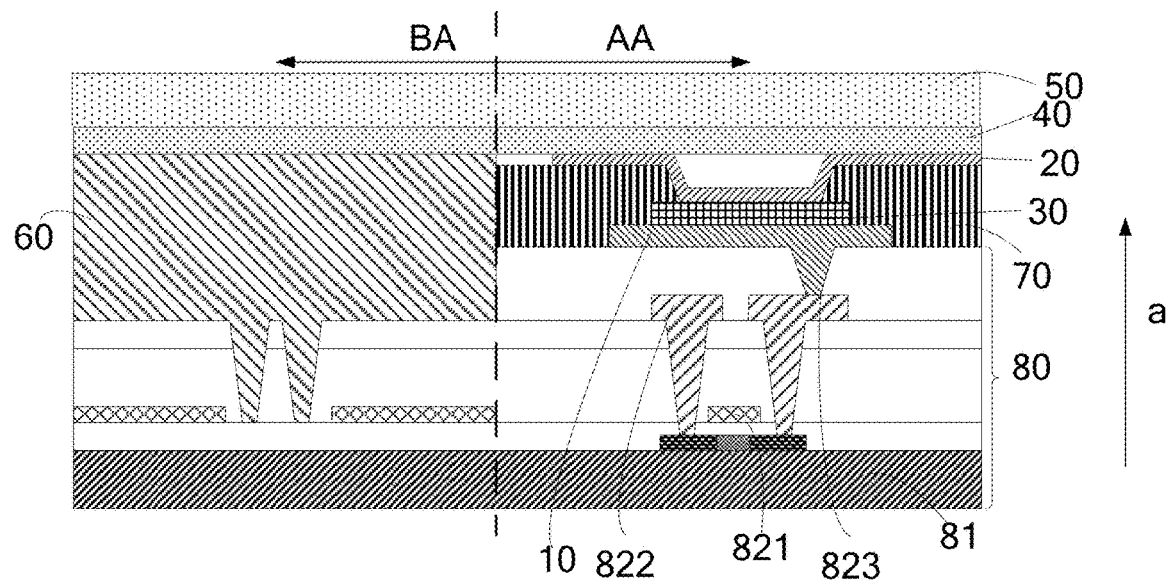
FIG. 23 illustrates a schematic diagram of film layers of another exemplary organic light-emitting display panel consistent with s disclosed embodiments of the present disclosure.
Figure 24:
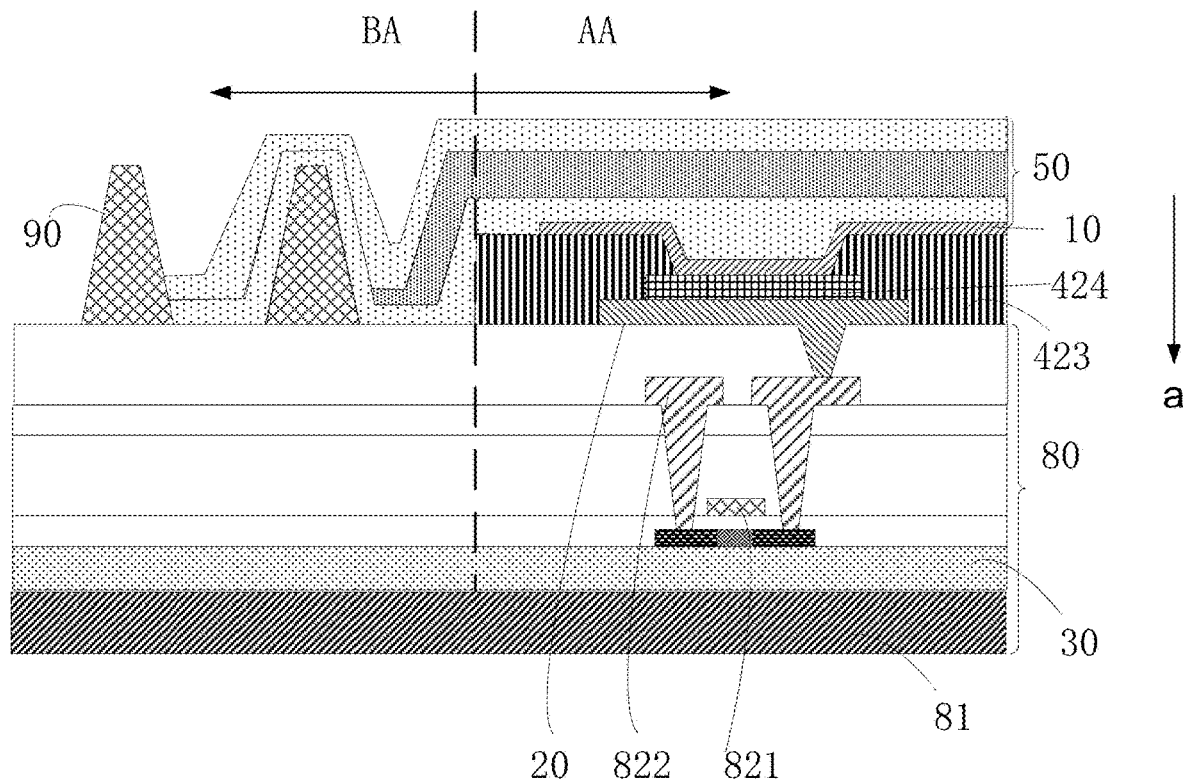
FIG. 24 illustrates a schematic diagram of film layers of another exemplary organic light-emitting display panel consistent with disclosed embodiments of the present disclosure.

The disclosed organic light-emitting display panel may be a rigid organic light-emitting display panel or a flexible organic light-emitting display panel. FIG. 23 illustrates a schematic diagram of film layers of another exemplary organic light-emitting display panel consistent with s disclosed embodiments of the present disclosure. FIG. 23 illustrates a rigid organic light-emitting display panel. FIG. 24 illustrates a schematic diagram of film layers of another exemplary organic light-emitting display panel consistent with disclosed embodiments of the present disclosure.

In one embodiment, as shown in FIG. 24, the organic light-emitting display panel may be a flexible organic light-emitting display panel. Referring to FIG. 23 and FIG. 24, both the rigid and the flexible organic light-emitting display panels may include an array substrate 80, an encapsulation layer 50, a first electrode layer 10, a second electrode layer 20, an organic light-emitting material layer 30, a pixel defining layer 70 that defines pixels of the display panel, and a light-coupling layer group 40 disposed between the array substrate 80 and the encapsulation layer 50. The array substrate 80 may include a base layer 81 and a thin film transistor.

The thin-film-transistor may include a gate electrode 821, a source 822, and a drain 823. For the top-emission type organic light-emitting display panel, no matter whether it is rigid or flexible, referring to FIG. 23, the first electrode layer 10 may be set as an anode, the second electrode layer 20 may be set as a cathode, and the light-coupling layer group 40 may be located between the cathode and the encapsulation layer 50. For the bottom-emission type organic light-emitting display panel, no matter whether it is rigid or flexible, referring to FIG. 24, the first electrode layer 10 may be set as a cathode, the second electrode layer 20 may be set as an anode, and the light-coupling layer group 40 may be disposed between the anode and the base layer 81.

In addition, in the rigid organic light-emitting display panel, as shown in FIG. 23, the encapsulation layer 50 may be a glass cover plate and may be bonded with the base layer 81 through a silver paste 60 in the non-display area 'BA'. In the flexible organic light-emitting display panel, as shown in FIG. 24, the encapsulation layer 50 may be a thin film encapsulation layer. The thin film encapsulation layer may extend from the display area 'AA' to the non-display area. The organic material in the thin film encapsulation layer may be protected from overflowing through a dam structure 90 in the non-display area.

In one embodiment, referring to FIG. 23, the light-coupling layer group 40 may have a first side facing the second electrode layer 20 and an opposing second side far away from the second electrode layer 20. The encapsulation layer 50 may be disposed on the opposing second side of the light-coupling layer group 40. In the light-coupling layer group 40, the refractive index of the second light-coupling layer arranged closest to the encapsulation layer 50 may be different from the refractive index of the encapsulation layer 50. Therefore, the light incident on the encapsulation layer 50 after passing through the light-coupling layer group 40 may be refracted at the interface between the second light-coupling layer and the encapsulation layer 50 and be emitted from the encapsulation layer 50.

In one embodiment, referring to FIG. 24, the base layer 81 may be disposed on the opposing second side of the light-coupling layer group 40. In the light-coupling layer group 40, the refractive index of the second light-coupling layer arranged closest to the base layer may be different from the refractive index of the base layer 81. Therefore, the light incident on the base layer 81 after passing through the light-coupling layer group 40 may be refracted at the interface between the second light-coupling layer and the base layer 81 and be emitted from the base layer 81.

Figure 25:
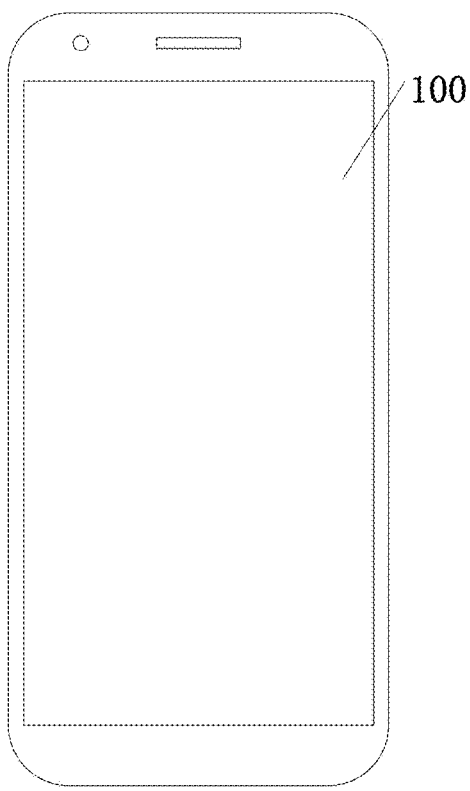
FIG. 25 illustrates a schematic diagram of an exemplary display device consistent with disclosed embodiments of the present disclosure.

The present disclosure also provides a display device. FIG. 25 illustrates schematic diagram of an exemplary display device consistent with disclosed embodiments of the present disclosure. The disclosed display device may include any display panel 100 in the present disclosure. FIG. 25 illustrates a cell phone for illustrative purposes, and is not intended to limit the scope of the present disclosure. The display device may be other mobile communication devices, a display device with a touch function, a non-touch display device, and is not limited in the present disclosure. Because the disclosed display device includes the display panel in the disclosed embodiments, the display device may accordingly have related advantages of the display panel. The implementation of the display device may be referred to the implementation of the disclosed display panel, and is not repeated herein.

In the disclosed embodiments, light-coupling layer group including at least one light-coupling stacked layer may be provided, and the at least one light-coupling stacked layer may include two light-coupling layers having different refractive indices. The light-coupling layer having a high refractive index may be arranged close to the organic light-emitting material layer, and the light-emission efficiency of the OLED micro-cavity structure may be improved by the light-coupling layer having a high refractive index. The light-coupling layer having a low refractive index may be arranged above the light-coupling layer having a high refractive index when the light-emitting direction is upward, such that the light emission of the light-coupling layer having a high refractive index may be further adjusted to synergistically enhance the light-emission efficiency.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodi-

What is claimed is:

1. An organic light-emitting display panel, comprising:
a first electrode layer, including a reflective electrode;
a second electrode layer, arranged opposite to the first electrode layer and including a semi-reflective electrode;
a light-emitting material layer, disposed between the first electrode layer and the second electrode layer, wherein the second electrode layer has a first side facing the light-emitting material layer and an opposing second side far away from the light-emitting material layer; and
a light-coupling layer group, disposed on the opposing second side of the second electrode layer, wherein the light-coupling layer group includes at least one light-coupling stacked layer, the at least one light-coupling stacked layer includes a first light-coupling layer arranged close to the second electrode layer and a second light-coupling layer arranged far away from the second electrode layer, a refractive index of the first light-coupling layer is larger than a refractive index of the second light-coupling layer in the at least one light-coupling stacked layer, wherein:
in the at least one light-coupling stacked layer, the first light-coupling layer has a first surface facing the second light-coupling layer and an opposing second surface,
the first surface of the first light-coupling layer includes a plurality of micro-trench structures,
the second light-coupling layer is at least partially embedded into a micro-trench structure, and
the at least one light-coupling stacked layer includes a first light-coupling stacked unit, a second light-coupling stacked unit, and a third light-coupling stacked unit, wherein:
the first light-coupling stacking unit includes a first light-coupling sub-layer adjacent to the second electrode layer and a second light-coupling sub-layer away from the second electrode layer, the second light-coupling stacking unit includes a third light-coupling sub-layer adjacent to the second electrode layer and a fourth light-coupling sub-layer away from the second electrode layer, and the third light-coupling stacking unit includes a fifth light-coupling sub-layer adjacent to the second electrode layer and a sixth light-coupling sub-layer away from the second electrode layer,
thicknesses of the first light-coupling stacked unit, the second light-coupling stacked unit, and the third light-coupling stacked unit along a first direction sequentially increase, and the first direction is perpendicular to a plane where the light-emitting material layer is located, and
the light-emitting material layer includes a red organic light-emitting material, a green organic light-emitting material, and a blue organic light-emitting material, wherein an orthogonal projection of the first light-coupling stacked unit onto the light-emitting material layer covers the blue organic light-emitting material, an orthogonal projection of the second light-coupling stacked unit onto the light-emitting material layer covers the green organic light-emitting material, and an orthogonal projection of the third light-coupling stacked unit onto the light-emitting material layer covers the red organic light-emitting material.

2. The organic light-emitting display panel according to claim 1, wherein:
in the at least one light-coupling stacked layer, a contact surface between the first light-coupling layer and the second light-coupling layer is a planar surface.

3. The organic light-emitting display panel according to claim 1, wherein:
in the at least one light-coupling stacked layer, the plurality of micro-trench structures are randomly distributed on the first surface of the first light-coupling layer.

4. The organic light-emitting display panel according to claim 1, wherein:
in the at least one light-coupling stacked layer, the plurality of micro-trench structures are arranged in an array.

5. The organic light-emitting display panel according to claim 4, wherein:
a distance between two adjacent micro-trench structures is in a range of approximately 200 nm-5 µm.

6. The organic light-emitting display panel according to claim 1, wherein:
a cross-section of the micro-trench structure has one of a semicircular shape and a polygonal shape,
wherein the cross-section of the micro-trench structure is perpendicular to a plane where the light-emitting material layer is located.

7. The organic light-emitting display panel according to claim 1, wherein:
the light-coupling layer group includes a plurality of light-coupling stacked layers successively disposed in a first direction, and
refractive indices of the first light-coupling layer and the second light-coupling layer adjacent to the first light-coupling layer in the first direction are different,
wherein the first direction is perpendicular to a plane where the light-emitting material layer is located.

8. The organic light-emitting display panel according to claim 1, wherein:
the second light-coupling layer is made of an air-gel material, wherein the air-gel material includes SiO air-gel.

9. The organic light-emitting display panel according to claim 1, wherein:
the second light-coupling layer is made of an inorganic material, wherein the inorganic material includes at least one of $BaF_2$, LiF, $MgF_2$, $AlF_3$, $Na_3AlF_6$, and $Na_5Al_3F_{14}$.

10. The organic light-emitting display panel according to claim 1, wherein:
the second light-coupling layer is made of an organic material, wherein the organic material includes one of polysilane, polysiloxane, acrylic and polycarbonate.

11. The organic light-emitting display panel according to claim 1, wherein:
a thickness of the first light-coupling layer is in a range of approximately 10 nm-1000 nm, and
a thickness of the second light-coupling layer is in a range of approximately 10 nm-1000 nm.

12. The organic light-emitting display panel according to claim 1, wherein:
the refractive index of the first light-coupling layer is greater than or equal to approximately 1.5.

13. The organic light-emitting display panel according to claim 1, wherein:

in the at least one light-coupling stacked layer, a difference between the refractive index of the first light-coupling layer and the refractive index of the second light-coupling layer is greater than or equal to approximately 0.1 and less than or equal to approximately 2.5.

14. The organic light-emitting display panel according to claim 1, wherein:
the light-emitting material layer includes a hole injection layer, a hole transport layer, a light-emitting layer, an electron transport layer, and an electron injection layer sequentially arranged along a direction from the first electrode layer to the second electrode layer.

15. The organic light-emitting display panel according to claim 1, further including:
a base layer,
wherein the light-coupling layer group has a first side facing the second electrode layer and an opposing second side, and the base layer is disposed on the opposing second side of the light-coupling layer group, and
in the light-coupling layer group, the refractive index of the second light-coupling layer arranged closest to the base layer is different from a refractive index of the base layer.

16. A display device, comprising:
an organic light-emitting display panel, including:
a first electrode layer, including a reflective electrode,
a second electrode layer, arranged opposite to the first electrode layer and including a semi-reflective electrode,
a light-emitting material layer, disposed between the first electrode layer and the second electrode layer, wherein the second electrode layer has a first side facing the light-emitting material layer and an opposing second side far away from the light-emitting material layer, and
a light-coupling layer group, disposed on the opposing second side of the second electrode layer, wherein the light-coupling layer group includes at least one light-coupling stacked layer, the at least one light-coupling stacked layer includes a first light-coupling layer arranged close to the second electrode layer and a second light-coupling layer arranged far away from the second electrode layer, a refractive index of the first light-coupling layer is larger than a refractive index of the second light-coupling layer in the at least one light-coupling stacked layer, wherein:
in the at least one light-coupling stacked layer, the first light-coupling layer has a first surface facing the second light-coupling layer and an opposing second surface,
the first surface of the first light-coupling layer includes a plurality of micro-trench structures,
the second light-coupling layer is at least partially embedded into a micro-trench structure, and
the at least one light-coupling stacked layer includes a first light-coupling stacked unit, a second light-coupling stacked unit, and a third light-coupling stacked unit, wherein:
the first light-coupling stacking unit includes a first light-coupling sub-layer adjacent to the second electrode layer and a second light-coupling sub-layer away from the second electrode layer, the second light-coupling stacking unit includes a third light-coupling sub-layer adjacent to the second electrode layer and a fourth light-coupling sub-layer away from the second electrode layer, and the third light-coupling stacking unit includes a fifth light-coupling sub-layer adjacent to the second electrode layer and a sixth light-coupling sub-layer away from the second electrode layer,
thicknesses of the first light-coupling stacked unit, the second light-coupling stacked unit, and the third light-coupling stacked unit along a first direction sequentially increase, and the first direction is perpendicular to a plane where the light-emitting material layer is located, and
the light-emitting material layer includes a red organic light-emitting material, a green organic light-emitting material, and a blue organic light-emitting material, wherein an orthogonal projection of the first light-coupling stacked unit onto the light-emitting material layer covers the blue organic light-emitting material, an orthogonal projection of the second light-coupling stacked unit onto the light-emitting material layer covers the green organic light-emitting material, and an orthogonal projection of the third light-coupling stacked unit onto the light-emitting material layer covers the red organic light-emitting material.

17. An organic light-emitting display panel, comprising:
a first electrode layer, including a reflective electrode;
a second electrode layer, arranged opposite to the first electrode layer and including a semi-reflective electrode;
a light-emitting material layer, disposed between the first electrode layer and the second electrode layer, wherein the second electrode layer has a first side facing the light-emitting material layer and an opposing second side far away from the light-emitting material layer;
a light-coupling layer group, disposed on the opposing second side of the second electrode layer, wherein the light-coupling layer group includes at least one light-coupling stacked layer, the at least one light-coupling stacked layer includes a first light-coupling layer arranged close to the second electrode layer and a second light-coupling layer arranged far away from the second electrode layer, a refractive index of the first light-coupling layer is larger than a refractive index of the second light-coupling layer in the at least one light-coupling stacked layer; and
an encapsulation layer, wherein:
the light-coupling layer group has a first side facing the second electrode layer and an opposing second side, and the encapsulation layer is disposed on the opposing second side of the light-coupling layer group,
in the light-coupling layer group, the refractive index of the second light-coupling layer arranged closest to the encapsulation layer is different from a refractive index of the encapsulation layer, and
the at least one light-coupling stacked layer includes a first light-coupling stacked unit, a second light-coupling stacked unit, and a third light-coupling stacked unit, wherein:
the first light-coupling stacking unit includes a first light-coupling sub-layer adjacent to the second electrode layer and a second light-coupling sub-layer away from the second electrode layer, the second light-coupling stacking unit includes a third light-coupling sub-layer adjacent to the second electrode layer and a fourth light-coupling sub-layer away from the second electrode layer, and the third light-coupling stacking unit includes a fifth light-coupling sub-layer adjacent to the second electrode layer and a sixth light-coupling sub-layer away from the second electrode layer, thicknesses of the first light-coupling stacked unit, the second light-coupling stacked unit, and the third light-coupling stacked unit along a first direction sequentially increase, and the first direction is perpendicular to a plane where the light-emitting material layer is located, and the light-emitting material layer includes a red organic light-emitting material, a green organic light-emitting material, and a blue organic light-emitting material, wherein an orthogonal projection of the first light-coupling stacked unit onto the light-emitting material layer covers the blue organic light-emitting material, an orthogonal projection of the second light-coupling stacked unit onto the light-emitting material layer covers the green organic light-emitting material, and an orthogonal projection of the third light-coupling stacked unit onto the light-emitting material layer covers the red organic light-emitting material.

\* \* \* \* \*